United States Patent
Ziv

(10) Patent No.: US 8,965,944 B2
(45) Date of Patent: *Feb. 24, 2015

(54) GENERATION OF TEST CASES WITH RANGE CONSTRAINTS FOR FLOATING POINT ADD AND SUBTRACT INSTRUCTIONS

(75) Inventor: Abraham Ziv, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 291 days.

This patent is subject to a terminal disclaimer.

(21) Appl. No.: 13/448,761

(22) Filed: Apr. 17, 2012

(65) Prior Publication Data

US 2012/0203813 A1    Aug. 9, 2012

Related U.S. Application Data

(63) Continuation of application No. 12/193,396, filed on Aug. 18, 2008, now Pat. No. 8,185,569, which is a continuation of application No. 11/093,573, filed on Mar. 30, 2005, now abandoned.

(30) Foreign Application Priority Data

Mar. 31, 2004    (GB) .................................. 0407208.8

(51) Int. Cl.
*G06F 7/38*      (2006.01)
*G06F 17/50*     (2006.01)

(Continued)

(52) U.S. Cl.
CPC ............ *G06F 17/5022* (2013.01); *G06F 7/483* (2013.01); *G06F 7/49957* (2013.01)
USPC ....................................................... 708/495

(58) Field of Classification Search
CPC ..... G06F 7/572; G06F 7/49905; G06F 7/483; G06F 9/3001; G06F 7/4876
USPC .................................................. 708/495–514
See application file for complete search history.

(56) References Cited

U.S. PATENT DOCUMENTS 7,295,956 B1    11/2007  Ruetsch
7,367,001 B2     4/2008  Baumgartner et al.

OTHER PUBLICATIONS

An American National Standard, IEEE Standard for Binary Floating-Point Arithmetic, IEEE std 754-1985, 1985.

(Continued)

*Primary Examiner* — Tan V. Mai
(74) *Attorney, Agent, or Firm* — Scully, Scott, Murphy & Presser, P.C.; Janice Kwon, Esq.

(57) ABSTRACT

Methods, apparatus and systems are disclosed for the generation of range-constrained test cases for verification of designs of arithmetic floating point units. Given three ranges of floating point numbers Rx, Ry, Rz, a floating point operation (op), and a rounding-mode (round), three floating point numbers $\bar{x}$, $\bar{y}$, $\bar{z}$ are generated such that $\bar{x} \in Rx$, $\bar{y} \in Ry$, $\bar{z} \in Rz$, and $\bar{z}$=round ( $\bar{x}$ op $\bar{y}$). Solutions are provided for add and subtract operations. Range constraints are imposed on the input operands and on the result operand of floating point add and subtract instructions to target corner cases when generating test cases for use in verification of floating point hardware.

6 Claims, 5 Drawing Sheets

(51) Int. Cl.
G06F 7/483 (2006.01)
G06F 7/499 (2006.01)

(56) References Cited

OTHER PUBLICATIONS

Grinwald, Raanan et al., User Defined Coverage—A Tool Supported Methodology for Design Verification, DAC 98, Jun. 15-19, 1998, pp. 158-163, San Francisco, CA.

Kahan, W., A Test for Correctly Rounded SQRT, May 31, 1996.

McFearin, Lee D. et al., Generation and Analysis of Hard to Round Cases for Binary Floating Point Division, IEEE, 2001, 119-127.

Parks, Michael, Number-theoretic Test Generation for Directed Rounding, Java Technology Group, Sun Microsystems, Palo Alto, CA.

Lewin, Daniel et al., Constraint Satisfaction for Test Program Generation, IEEE, 1995, pp. 45-48.

Aharon, Aharon et al., Test Program Generation for Functional Verification of PowePC Processors in IBM, 32nd ACM/IEEE Design Automation Conference, 1995.

Fournier, Laurent et al., FPgen—A Deep-Knowledge Test Generator for Floating Point Verification, IBM Research Report, Computer Science, H-0140, Oct. 10, 2002.

Ziv, Abraham et al., Solving the generalized mask constraint for test generation of binary floating point add operation, Theoretical Computer Science, 2003, pp. 183-201, vol. 291.

U.S. Office Action dated Jun. 28, 2011 received in related U.S. Appl. No. 12/193,419.

U.S. Office Action dated Jun. 28, 2011 received in related U.S. Appl. No. 12/193,396.

U.S. Notice of Allowance mailed Oct. 18, 2011 received in related U.S. Appl. No. 12/193,419.

U.S. Office Action dated Oct. 27, 2011 received in related U.S. Appl. No. 12/193,396.

U.S. Notice of Allowance mailed Jan. 18, 2012 received in related U.S. Appl. No. 12/193,396.

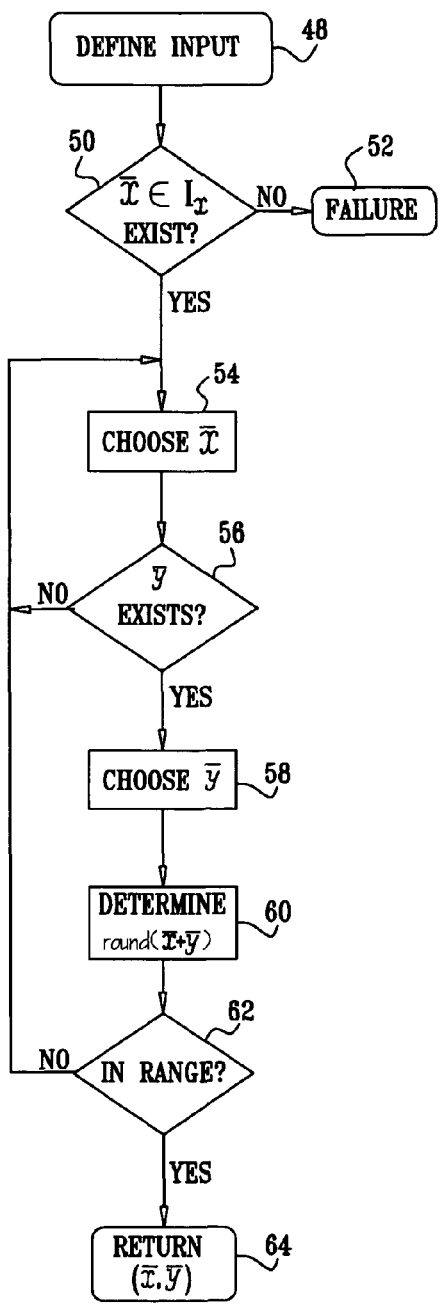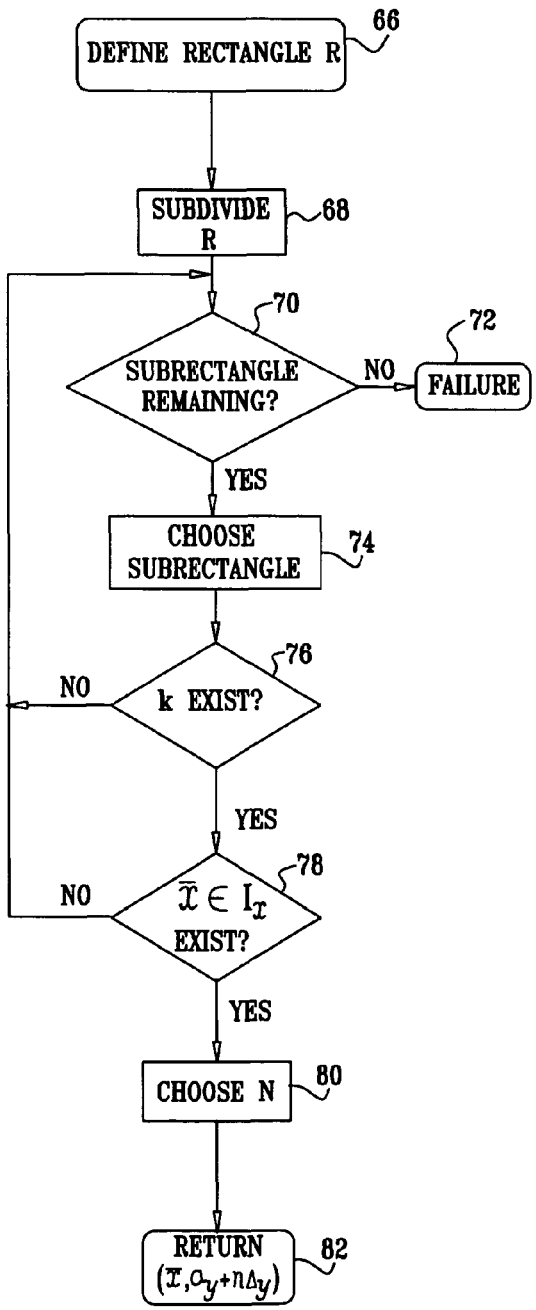

GENERATION OF TEST CASES WITH RANGE CONSTRAINTS FOR FLOATING POINT ADD AND SUBTRACT INSTRUCTIONS

CROSS-REFERENCE TO RELATED APPLICATIONS

This application is a continuation of U.S. Ser. No. 12/193,396, filed on Aug. 18, 2008, which is a continuation of U.S. Ser. No. 11/093,573, filed on Mar. 30, 2005, the entire contents of each of which are incorporated herein by reference.

FIELD OF THE INVENTION

This invention relates to design verification. More particularly, this invention relates to the generation of numerical test cases for floating point arithmetic units.

BACKGROUND OF THE INVENTION

When developing integrated circuits that perform floating point arithmetic, designers typically base the representations of floating point (FP) numbers and the constraints on the results of arithmetic operations on published standards, such as the document *IEEE Standard for Binary Floating Point Arithmetic, An American National Standard*, ANSI/IEEE Std. 754-1995. Adherence to such standards guarantees that the circuitry will perform floating point arithmetic with acceptable and predictable results. Although it is a relatively straightforward task to implement floating point standards in a floating point hardware unit, designers usually make modifications in the implementation to improve performance in special cases. Because of this, it is necessary to verify compliance of the finished design with the selected standard. In many instances, errors in floating point implementation escape detection and find their way into production. Cases such as the well-known Pentium bug show that the verification process in this area is still far from being optimal. The ever-growing demand for increased performance, reduced time-to-market, and decreasing tolerance for errors all combine to make verification increasingly harder.

The term "floating point unit" herein denotes any device or system capable of performing binary floating point computations by any means including, but not limited to, hardware, firmware, programmable logic arrays, and software.

Floating point unit verification presents a unique challenge in the field of processor verification. The particular complexity of this area stems from the vast test-space, which includes many corner cases that should be targeted, and from the intricacies of the implementation of floating point operations.

One approach involves using formal methods to develop proofs of adherence to a standard. While promising, formal methods are still far from providing a complete answer to the problem. Simulation is a more traditional approach to floating point unit verification. The rationale behind verification by simulation is that one acquires confidence in the correctness of a floating point unit design by running a set of test cases that encompass a sufficiently large number of different cases, which in some sense is assumed to be a representative sample of the full space. The ability of the floating point unit design to correctly handle all cases is inferred from the correct handling of the cases actually tested. This approach is discussed, for example, in the document *User Defined Coverage—A Tool Supported Methodology for Design Verification*, Raanan Grinwald, Eran Harel, Michael Orgad, Shmuel Ur, and Avi Ziv, Proc. 38th Design Automation Conference (DAC38), pages 158-163, 1998. When conducting simulation, it is desirable to define a particular subspace, which is considered to be "interesting" in terms of verification, and then to generate tests selected at random out of the subspace.

Examples of algorithms that may be used for test generation may be found in the following documents:

*How to Test Whether SQRT is Rounded Correctly*, W. Kahan. http://www.cs.berkeley.edu/~wkahan/SQRTest.ps;

*Generation and Analysis of Hard To Round Cases for Binary Floating Point Division*, Lee D. McFearin and David W. Matula, IEEE 15th Symposium on Computer Arithmetic (ARITH15), pages 119-127, 2001; and

*Number-Theoretic Test Generation for Directed Rounding*, Michael Parks, Proc. IEEE 14th Symp. Computer Arithmetic (ARITH14), pages 241-248, 1999.

Test cases developed by algorithms such as the foregoing are typically implemented on a test generator, which may optionally bias the tests based on internal testing knowledge. Such test generators are described in the following documents: *Model-Based Test Generation For Processor Design Verification*, Y. Lichtenstein, Y. Malka and A. Aharon, Innovative Applications of Artificial Intelligence (IAAI), AAAI Press, 1994; *Constraint Satisfaction for Test Program Generation*, L. Fournier, D. Lewin, M. Levinger, E. Roytman and Gil Shurek, Int. Phoenix Conference on Computers and Communications, March 1995; and *Test Program Generation for Functional Verification of PowerPC Processors in IBM*, A. Aharon, D. Goodman, M. Levinger, Y. Lichtenstein, Y. Malka, C. Metzger, M. Molcho and G. Shurek, 32nd Design Automation Conference, San Francisco, June 1995, pp. 279-285.

More recently, test cases have been implemented in a floating point test generator, FPgen, at the IBM Haifa Research Laboratories, as disclosed in the document *A Deep Knowledge Test Generator for Floating Point Verification*, S. Asaf and L. Fournier. FPgen—Technical Report H-0140, IBM Israel, 2002, http://domino.watson.ibm.com/library/cyberdig.nsf/Home, which is herein incorporated by reference. FPgen is an automatic floating point test generator, which receives as input the description of a floating point coverage task and outputs a random test that covers this task. A coverage task is defined by specifying a floating point instruction and a set of constraints on the inputs, the intermediate results, and the final result. For each task, the generator produces a random test that satisfies all the constraints. FPgen employs various algorithms, both analytic and heuristic, to solve the various constraint types.

Test generation for the addition instruction FP-ADD, where the input sets are described as masks, is discussed in the document *Solving The Generalized Mask Constraint for Test Generation of Binary Floating Point Add Operation*, Abraham Ziv and Laurent Fournier, Theoretical Computer Science, 291:183-201, 2003, which is herein incorporated by reference. While this technique is effective for mask-constrained test generation, verification of floating point units would be further advanced by an improved technique for generating meaningful range-constrained test cases.

SUMMARY OF THE INVENTION

According to a disclosed embodiment of the invention, methods and systems are disclosed for the generation of range-constrained test cases for verification of designs of arithmetic floating point units. Thus, the invention provides a method for verifying a design of a floating point computation unit, which is carried out by receiving a definition of a floating point operation, the definition including a first floating point operand having a first floating point input interval, a second floating point operand having a second floating point input interval, and a floating point result having a floating point output interval. The first and second floating point input intervals and the floating point output interval have respective upper and lower floating point limits. The method is further carried out by defining a first reduced interval for the first floating point operand responsively to the floating point limits of the second floating point input interval and the floating point output interval, selecting a first machine number in the first floating point input interval, defining a second reduced interval for the second floating point operand responsively to the first machine number and to the limits of the floating point output interval, selecting a second machine number in the second reduced interval, and testing the floating point operation in the design using the first machine number and the second machine number as the first floating point operand and the second floating point operand.

According to an aspect of the method, at least one of the first machine number and the second machine number is chosen randomly.

In a further aspect of the method the first reduced interval and the second reduced interval are defined by setting new boundaries for the first floating point input interval and the second floating point input interval that are referenced to a set of real numbers.

According to yet another aspect of the method, the floating point operation is addition or subtraction.

The invention provides a computer software product, including a computer-readable medium in which computer program instructions are stored, which instructions, when read by a computer, cause the computer to perform a method for verifying a design of a floating point computation unit, which is carried out by receiving a definition of a floating point operation, the definition including a first floating point operand having a first floating point input interval, a second floating point operand having a second floating point input interval, and a floating point result having a floating point output interval. The first and second floating point input intervals and the floating point output interval have respective upper and lower floating point limits. The method is further carried out by defining a first reduced interval for the first floating point operand responsively to the floating point limits of the second floating point input interval and the floating point output interval, selecting a first machine number in the first floating point input interval, defining a second reduced interval for the second floating point operand responsively to the first machine number and to the limits of the floating point output interval, selecting a second machine number in the second reduced interval, and testing the floating point operation in the design using the first machine number and the second machine number as the first floating point operand and the second floating point operand.

The invention provides a design verification system for a floating point computation unit.

The invention provides a method for verifying a design of a floating point computation unit, which is carried out by receiving a definition of a floating point operation to test.

According to an additional aspect of the method, at least one of the first machine number, the integer, and the second machine number is chosen randomly.

The invention provides a method for verifying a design of a floating point computation unit, which is carried out by receiving a definition of a floating point operation.

The invention provides a computer software product, including a computer-readable medium in which computer program instructions are stored, which instructions, when read by a computer, cause the computer to perform a method for verifying a design of a floating point computation unit.

The invention provides a design verification system for a floating point computation unit, including a processor adapted to execute a generator that receives a definition of a floating point operation to test.

The invention provides a method for generating a test case in a design verification system, the test case including a first input operand, a second input operand and a floating point arithmetic operation performed thereon to yield an output result.

The invention provides a design verification system for an arithmetic floating point unit, including a processor adapted to execute a generator for generating a test case.

The invention provides a design verification system for an arithmetic floating point unit, including a processor adapted to execute a generator for generating a test case.

The invention provides a method for generating a test case in a design verification system, the test case including a first input operand, a second input operand and a floating point arithmetic operation performed thereon to yield an output result.

BRIEF DESCRIPTION OF THE DRAWINGS

For a better understanding of the present invention, reference is made to the detailed description of the invention, by way of example, which is to be read in conjunction with the following drawings, wherein like elements are given like reference numerals, and wherein:

FIG. 4 is a flow chart illustrating a method of generating range-constrained floating point numbers employing a continuous algorithm in accordance with a disclosed embodiment of the invention;

FIG. 5 is a flow chart illustrating a method of generating range-constrained floating point numbers employing a discrete algorithm in accordance with an alternate embodiment of the invention.

DETAILED DESCRIPTION OF THE INVENTION

Figure 1:
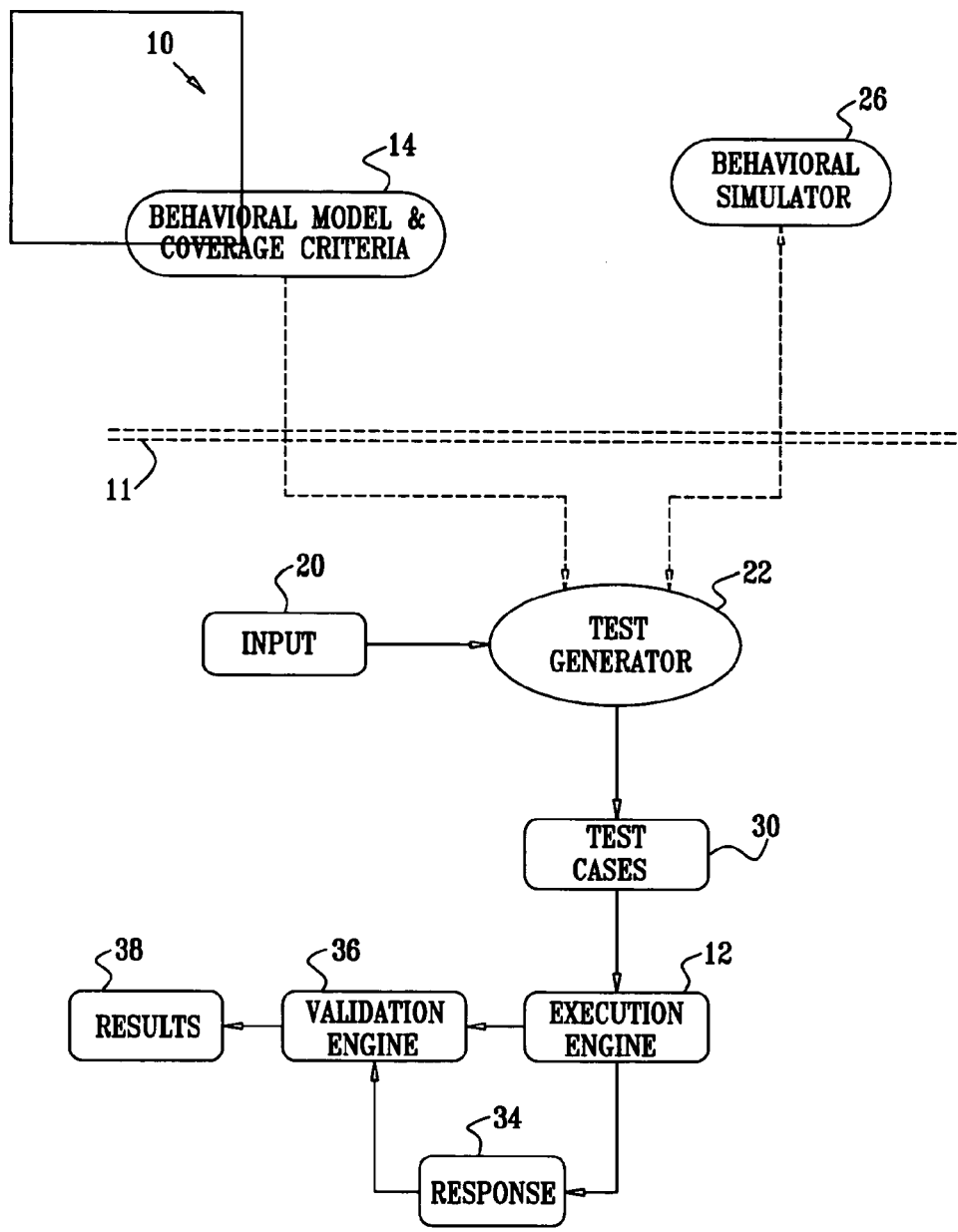
FIG. 1 is a block diagram of a verification system that is operable in accordance with a disclosed embodiment of the invention.

In the following description, numerous specific details are set forth in order to provide a thorough understanding of the present invention. It will be apparent to one skilled in the art, however, that the present invention may be practiced without these specific details. In other instances well-known circuits, control logic, and the details of computer program instructions for conventional algorithms and processes have not been shown in detail in order not to unnecessarily obscure the present invention.

Software programming code, which embodies aspects of the present invention, is typically maintained in permanent storage, such as a computer readable medium. In a client-server environment, such software programming code may be stored on a client or a server. The software programming code may be embodied on any of a variety of known media for use with a data processing system. This includes, but is not limited to, magnetic and optical storage devices such as disk drives, magnetic tape, compact discs (CD's), digital video discs (DVD's), and computer instruction signals embodied in a transmission medium with or without a carrier wave upon which the signals are modulated. For example, the transmission medium may include a communications network, such as the Internet. In addition, while the invention may be embodied in computer software, the functions necessary to implement the invention may alternatively be embodied in part or in whole using hardware components such as application-specific integrated circuits or other hardware, or some combination of hardware components and software.

Notation.

Using the notation of the IEEE standard for binary floating point arithmetic, 1985 (IEEE standard 754), a floating-point number v is represented by three values: S(v), E(v), and F(v), which denote the sign, the exponent and the significand, respectively. The value of v is:

$$u=(-1)^{S(u)} \cdot 2^{E(u)} \cdot F(u).$$

Precision (p) signifies the number of bits in the significand, F, of the floating-point number.

"Unit in the last place" (ulp(x)) is the weight of one unit in the least significant bit of the significand of x. The ulp of a floating-point number with exponent E and precision p, is $2^{E+1-p}$.

Floating point numbers, generally referred to herein as "machine numbers", are represented by lower-case letters with an upper bar, for example $\bar{x}$. This notation is used to distinguish them from real numbers, which are represented by regular lower-case letters, for example x.

Overview

As an example of an instruction that may be tested according to the invention, it is interesting to check the subtraction instruction FP-SUB, having two inputs that are normalized numbers and an output that is denormal, Such a result occurs when the inputs have values that are close to each other, resulting in a massive cancellation of the most significant bits of the inputs, and an underflow in the result.

As a more general example, consider the following 10 major IEEE floating point types: ±normalized numbers, ±denormal numbers, ±zero, ±infinity, and ±NaNs (not a number). A common—albeit far from trivial to fulfill—coverage model is one that requires enumeration of all these types, simultaneously, for all operands of all floating point instructions (the "All IEEE Types" model). For a given instruction with three operands, this potentially yields a thousand cases that must be covered.

For a binary instruction, it is interesting to generate test cases (when possible) for all combinations of selecting two inputs and the output from among the above-noted IEEE floating point types.

Subsets of the set of floating point numbers may be represented in various ways. Some examples of common representations are:

1. Ranges of floating point numbers.
2. Masks. In this representation each bit may take on one of the values 0, 1, X, where X specifies that both 0 and 1 are possible. For example, 01X1X represents the set {01010, 01011, 01110, 01111}.
3. Number of 1's (0's). This defines the set of all floating point numbers that have a given number of 1's (0's).

Probably the most natural of these, in the context of test generation, is the representation as ranges. The primary advantage in representing sets of numbers as ranges is simplicity. All the basic types of floating point numbers are readily defined in terms of ranges. Furthermore, many interesting sets of numbers can be efficiently represented as a union of ranges.

According to embodiments of the invention, methods and systems are disclosed for the generation of range-constrained test cases for verification of designs of arithmetic floating point units. Given three ranges of floating point numbers Rx, Ry, Rz, a floating point operation (op), and a rounding-mode (round), three floating point numbers $\bar{x}$, $\bar{y}$, $\bar{z}$ are generated such that $\bar{x} \in Rx$, $\bar{y} \in Ry$, $\bar{z} \in Rz$, and $\bar{z}$=round ($\bar{x}$ op $\bar{y}$). This problem, although quite simple when dealing with intervals of real numbers, is much more complex when considering ranges of machine numbers. Full solutions are provided for add and subtract operations. Range constraints are imposed on the input operands and on the result operand of floating point add and subtract instructions to target corner cases when generating test cases for use in verification of floating point hardware.

The invention provides a method for verifying a design of a floating point computation unit, which is carried out by receiving a definition of a floating point operation, the definition including a first floating point operand having a first floating point input interval, a second floating point operand having a second floating point input interval, and a floating point result having a floating point output interval. The first and second floating point input intervals and the floating point output interval have respective upper and lower floating point limits. The method is further carried out by defining a first reduced interval for the first floating point operand responsively to the floating point limits of the second floating point input interval and the floating point output interval, selecting a first machine number in the first floating point input interval, defining a second reduced interval for the second floating point operand responsively to the first machine number and to the limits of the floating point output interval, selecting a second machine number in the second reduced interval, and testing the floating point operation in the design using the first machine number and the second machine number as the first floating point operand and the second floating point operand.

According to an aspect of the method, at least one of the first machine number and the second machine number is chosen randomly. In a further aspect of the method the first reduced interval and the second reduced interval are defined by setting new boundaries for the first floating point input interval and the second floating point input interval that are referenced to a set of real numbers.

According to another aspect of the method, the set of real numbers is a set $$A_{x,y}=\{(x,y)|\bar{a}_x \leq x \leq \bar{b}_x, \bar{a}_y \leq y \leq \bar{b}_y, x+y \in I'_z\},$$

wherein x and y are real numbers in the set of real numbers, $\bar{a}_x$ is a smallest machine number in the first floating point input interval, $\bar{a}_y$ is a smallest machine number in the second floating point input interval, $\bar{b}_x$ is a largest machine number in the first floating point input interval, $\bar{b}_y$ is a largest machine number in the second floating point input interval, and $$I'_z=\{z|\bar{a}_z \leq \text{round}(z) \leq \bar{b}_z\}.$$

In another aspect of the method the first reduced interval and the second reduced interval are defined by setting new boundaries for the first floating point input interval and the second floating point input interval such that for all real numbers (x, y) in a set of real numbers $$A_{x,y}=\{(x,y)|\bar{a}_x\leq x\leq \bar{b}_x, \bar{a}_y\leq y\leq \bar{b}_y, x+y\in I'_z\}$$

wherein the first reduced interval and the second reduced interval have boundaries such that $$A_x=\max\{\bar{a}_x, a'_z-\bar{b}_y\}\leq x\leq \min\{\bar{b}_x, b'_z-\bar{a}_y\}=B_x,$$

and $$A_y=\max\{\bar{a}_y, a'_z-b_x\}\leq y\leq \min\{b_y, b'_z-\bar{a}_x\}B_y,$$

wherein x and y are real numbers in the set of real numbers, $A_x$ is a lower boundary of the first reduced interval, $B_x$ is an upper boundary of the first reduced interval, $A_y$ is a lower boundary of the second reduced interval, $B_y$ is an upper boundary of the second reduced interval, $\bar{a}_x$ is a smallest machine number in the first floating point input interval, $\bar{a}_y$ is a smallest machine number in the second floating point input interval, $\bar{b}_x$ is a largest machine number in the first floating point input interval, $\bar{b}_y$ is a largest machine number in the second floating point input interval, $I'_z\{z|\bar{a}_z\leq \text{round}(z)\leq \bar{b}_z\}$, $a'_z$ is a lower boundary of $I'_z$ and $b'_z$ is an upper boundary of $I'_z$.

According to yet another aspect of the method, the floating point operation is addition or subtraction.

The invention provides a computer software product, including a computer-readable medium in which computer program instructions are stored, which instructions, when read by a computer, cause the computer to perform a method for verifying a design of a floating point computation unit, which is carried out by receiving a definition of a floating point operation, the definition including a first floating point operand having a first floating point input interval, a second floating point operand having a second floating point input interval, and a floating point result having a floating point output interval. The first and second floating point input intervals and the floating point output interval have respective upper and lower floating point limits. The method is further carried out by defining a first reduced interval for the first floating point operand responsively to the floating point limits of the second floating point input interval and the floating point output interval, selecting a first machine number in the first floating point input interval, defining a second reduced interval for the second floating point operand responsively to the first machine number and to the limits of the floating point output interval, selecting a second machine number in the second reduced interval, and testing the floating point operation in the design using the first machine number and the second machine number as the first floating point operand and the second floating point operand.

The invention provides a design verification system for a floating point computation unit, including a processor adapted to execute a generator that receives a definition of a floating point operation to test, the definition including a first floating point operand having a first floating point input interval, a second floating point operand having a second floating point input interval, and a floating point result having a floating point output interval. The generator is operative to perform the steps of defining a first reduced interval for the first floating point operand responsively to the limits of the second floating point input interval and the floating point output interval, selecting a first machine number in the first floating point input interval, defining a second reduced interval for the second floating point operand responsively to the first machine number and to the upper and lower limits of the floating point output interval, selecting a second machine number in the second reduced interval. The processor is adapted to execute an execution engine for executing the floating point operation to test the floating point computation unit using the first machine number and the second machine number as the first floating point operand and the second floating point operand.

The invention provides a method for verifying a design of a floating point computation unit, which is carried out by receiving a definition of a floating point operation to test, the definition including a first floating point operand having a first floating point input interval and a second floating point operand having a second floating point input interval, and a floating point result having a floating point output interval. The input and output intervals have respective upper and lower floating point limits, whereby the first floating point input interval and the second floating point input interval define a region in an operand plane having a first and second axes corresponding respectively to the first floating point operand and the second floating point operand. The method is further carried out by dividing the region into subrectangles, each of the subrectangles having respective bounds, such that within at least a first subrectangle, a first step size between machine numbers in any first succession along the second axis is constant, and a second step size between the machine numbers in any second succession along the first axis is no less than the first step size. The method is further carried out by defining a reduced interval for the first floating point operand responsively to the upper and lower floating point limits of the second floating point input interval and the floating point output interval, selecting a first machine number in the reduced interval, defining an integer range responsively to the respective bounds of the first subrectangle, to the first machine number, and to the first step size, selecting an integer within the integer range, determining a second machine number responsively to the integer and to the first step size, and testing the floating point operation in the design using the first machine number and the second machine number as the first floating point operand and the second floating point operand.

According to an additional aspect of the method, at least one of the first machine number, the integer, and the second machine number is chosen randomly. A further aspect of the method includes verifying an existence of a second integer in the first subrectangle that satisfies a relation $(a'_z-\bar{a}_x-\bar{a}_y)/\Delta y\leq k\leq (b'_z-\bar{a}_x-\bar{a}_y)/\Delta y$, wherein k is the second integer, $\bar{a}_x$ is a smallest machine number of the first floating point input interval, $\bar{a}_y$ is a smallest machine number of the second floating point input interval, $I'_z$ is an interval defined by a set $\{z|\bar{a}_z\leq \text{round}(z)\leq \bar{b}_z\}$, $a'_z$ is a lower boundary of the interval $I'_z$, and $b'_z$ is an upper boundary of the interval $I'_z$, and $\Delta y$ is the second step size.

The invention provides a method for verifying a design of a floating point computation unit, which is carried out by receiving a definition of a floating point operation, the definition including a first floating point operand having a first floating point input interval, a second floating point operand having a second floating point input interval, and a floating point result having a floating point output interval. The first and second floating point input intervals and the floating point output interval have respective upper and lower floating point limits. The method is further carried out by defining a first reduced interval for the first floating point operand responsively to the floating point limits of the second floating point input interval and the floating point output interval, selecting a first machine number in the first floating point input interval, defining a second reduced interval for the second floating point operand responsively to the first machine number and to the limits of the floating point output interval, selecting a second machine number in the second reduced interval, and testing the floating point operation in the design using the first machine number and the second machine number as the first floating point operand and the second floating point operand.

According to an aspect of the method, at least one of the first machine number and the second machine number is chosen randomly. In a further aspect of the method the first reduced interval and the second reduced interval are defined by setting new boundaries for the first floating point input interval and the second floating point input interval that are referenced to a set of real numbers.

According to another aspect of the method, the set of real numbers is a set $$A_{x,y} = \{(x,y) | \bar{a}_x \leq x \leq \bar{b}_x, \bar{a}_y \leq y \leq \bar{b}_y, x+y \in I'_z\},$$

wherein x and y are real numbers in the set of real numbers, $\bar{a}_x$ is a smallest machine number in the first floating point input interval, $\bar{a}_y$ is a smallest machine number in the second floating point input interval, $\bar{b}_x$ is a largest machine number in the first floating point input interval, $\bar{b}_y$ is a largest machine number in the second floating point input interval, and $$I'_z = \{z | \bar{a}_z \leq \text{round}(z) \leq \bar{b}_z\}.$$

In another aspect of the method the first reduced interval and the second reduced interval are defined by setting new boundaries for the first floating point input interval and the second floating point input interval such that for all real numbers (x, y) in a set of real numbers $$A_{x,y} = \{(x,y) | \bar{a}_x \leq x \leq \bar{b}_x, \bar{a}_y \leq y \leq \bar{b}_y, x+y \in I'_z\},$$

wherein the first reduced interval and the second reduced interval have boundaries such that $$A_x = \max\{\bar{a}_x, a'_z - \bar{b}_y\} \leq x \leq \min\{\bar{b}_x, b'_z - \bar{a}_y\} = B_x,$$

and $$A_y = \max\{\bar{a}_y, a'_z - \bar{b}_x\} \leq y \leq \min\{\bar{b}_y, b'_z - \bar{a}_x\} = B_y,$$

wherein x and y are real numbers in the set of real numbers, $A_x$ is a lower boundary of the first reduced interval, $B_x$ is an upper boundary of the first reduced interval, $A_y$ is a lower boundary of the second reduced interval, $B_y$ is an upper boundary of the second reduced interval, $\bar{a}_x$ is a smallest machine number in the first floating point input interval, $\bar{a}_y$ is a smallest machine number in the second floating point input interval, $\bar{b}_x$ is a largest machine number in the first floating point input interval, $\bar{b}_y$ is a largest machine number in the second floating point input interval, $I'_z = \{z | \bar{a}_z \leq \text{round}(z) \leq \bar{b}_z\}$, $a'_z$ is a lower boundary of $I'_z$ and $b'_z$ is an upper boundary of $I'_z$.

According to yet another aspect of the method, the floating point operation is addition or subtraction.

The invention provides a computer software product, including a computer-readable medium in which computer program instructions are stored, which instructions, when read by a computer, cause the computer to perform a method for verifying a design of a floating point computation unit, which is carried out by receiving a definition of a floating point operation, the definition including a first floating point operand having a first floating point input interval, a second floating point operand having a second floating point input interval, and a floating point result having a floating point output interval. The first and second floating point input intervals and the floating point output interval have respective upper and lower floating point limits. The method is further carried out by defining a first reduced interval for the first floating point operand responsively to the floating point limits of the second floating point input interval and the floating point output interval, selecting a first machine number in the first floating point input interval, defining a second reduced interval for the second floating point operand responsively to the first machine number and to the limits of the floating point output interval, selecting a second machine number in the second reduced interval, and testing the floating point operation in the design using the first machine number and the second machine number as the first floating point operand and the second floating point operand.

The invention provides a design verification system for a floating point computation unit, including a processor adapted to execute a generator that receives a definition of a floating point operation to test, the definition including a first floating point operand having a first floating point input interval, a second floating point operand having a second floating point input interval, and a floating point result having a floating point output interval. The generator is operative to perform the steps of defining a first reduced interval for the first floating point operand responsively to the limits of the second floating point input interval and the floating point output interval, selecting a first machine number in the first floating point input interval, defining a second reduced interval for the second floating point operand responsively to the first machine number and to the upper and lower limits of the floating point output interval, selecting a second machine number in the second reduced interval. The processor is adapted to execute an execution engine for executing the floating point operation to test the floating point computation unit using the first machine number and the second machine number as the first floating point operand and the second floating point operand.

The invention provides a method for verifying a design of a floating point computation unit, which is carried out by receiving a definition of a floating point operation to test, the definition including a first floating point operand having a first floating point input interval and a second floating point operand having a second floating point input interval, and a floating point result having a floating point output interval. The input and output intervals have respective upper and lower floating point limits, whereby the first floating point input interval and the second floating point input interval define a region in an operand plane having a first and second axes corresponding respectively to the first floating point operand and the second floating point operand. The method is further carried out by dividing the region into subrectangles, each of the subrectangles having respective bounds, such that within at least a first subrectangle, a first step size between machine numbers in any first succession along the second axis is constant, and a second step size between the machine numbers in any second succession along the first axis is no less than the first step size. The method is further carried out by defining a reduced interval for the first floating point operand responsively to the upper and lower floating point limits of the second floating point input interval and the floating point output interval, selecting a first machine number in the reduced interval, defining an integer range responsively to the respective bounds of the first subrectangle, to the first machine number, and to the first step size, selecting an integer within the integer range, determining a second machine number responsively to the integer and to the first step size, and testing the floating point operation in the design using the first machine number and the second machine number as the first floating point operand and the second floating point operand.

According to an additional aspect of the method, at least one of the first machine number, the integer, and the second machine number is chosen randomly. A further aspect of the method includes verifying an existence of a second integer in the first subrectangle that satisfies a relation $(a'_z - \bar{a}_x - \bar{a}_y)/\Delta y \leq k \leq (b'_z - \bar{a}_x - \bar{a}_y)/\Delta y$, wherein k is the second integer, $\bar{a}_x$ is a smallest machine number of the first floating point input interval, $\bar{a}_y$ is a smallest machine number of the second floating point input interval, $I'_z$ is an interval defined by a set $\{z| \bar{a}_z \leq \text{round}(z) \leq \bar{b}\}$, $a'_z$ is a lower boundary of the interval $I'_z$ and $b'_z$ is an upper boundary of the interval $I'_z$, and $\Delta y$ is the second step size.

In one aspect of the method, the region also includes a second subrectangle. A third step size between the machine numbers in any third succession along the first axis is constant, and a fourth step size between the machine numbers in any fourth succession along the second axis is no less than the third step size.

The invention provides a computer software product, including a computer-readable medium in which computer program instructions are stored, which instructions, when read by a computer, cause the computer to perform a method for verifying a design of a floating point computation unit, which is carried out by receiving a definition of a floating point operation to test, the definition including a first floating point operand having a first floating point input interval and a second floating point operand having a second floating point input interval, and a floating point result having a floating point output interval. The input and output intervals have respective upper and lower floating point limits, whereby the first floating point input interval and the second floating point input interval define a region in an operand plane having a first and second axes corresponding respectively to the first floating point operand and the second floating point operand. The method is further carried out by dividing the region into subrectangles, each of the subrectangles having respective bounds, such that within at least a first subrectangle, a first step size between machine numbers in any first succession along the second axis is constant, and a second step size between the machine numbers in any second succession along the first axis is no less than the first step size. The method is further carried out by defining a reduced interval for the first floating point operand responsively to the upper and lower floating point limits of the second floating point input interval and the floating point output interval, selecting a first machine number in the reduced interval, defining an integer range responsively to the respective bounds of the first subrectangle, to the first machine number, and to the first step size, selecting an integer within the integer range, determining a second machine number responsively to the integer and to the first step size, and testing the floating point operation in the design using the first machine number and the second machine number as the first floating point operand and the second floating point operand.

The invention provides a design verification system for a floating point computation unit, including a processor adapted to execute a generator that receives a definition of a floating point operation to test, the definition including a first floating point operand having a first floating point input interval, a second floating point operand having a second floating point input interval, and a floating point result has a floating point output interval. The input and output intervals have respective upper and lower floating point limits, whereby the first floating point input interval and the second floating point input interval define a region in an operand plane having a first second axes corresponding respectively to the first floating point operand and the second floating point operand. The generator is operative to carry out a method comprising dividing the region into subrectangles, each of the subrectangles having respective bounds, such that within at least a first subrectangle, a first step size between machine numbers in any first succession along the second axis is constant, and a second step size between the machine numbers in any second succession along the first axis is no less than the first step size. The method is further carried out by defining a reduced interval for the first floating point operand responsively to the upper and lower floating point limits of the second floating point input interval and the floating point output interval, selecting a first machine number in the reduced interval, defining an integer range responsively to the respective bounds of the first subrectangle, to the first machine number, and to the first step size, selecting an integer within the integer range, determining a second machine number responsively to the integer and to the first step size. The processor is adapted to execute an execution engine for executing the floating point operation to test the floating point computation unit using the first machine number and the second machine number as the first floating point operand and the second floating point operand.

The invention provides a method for generating a test case in a design verification system, the test case including a first input operand, a second input operand and a floating point arithmetic operation performed thereon to yield an output result. The method is carried out by defining a first range that contains a set of first machine numbers, defining a second range that contains a set of second machine numbers, defining a third range having a lower bound that is a result of a round operation on a minimum value of the output result, and having an upper bound that is a result of the round operation on a maximum value of the output result, wherein instances of the first input operand and the second input operand are in the first range and the second range, respectively. The method is further carried out by defining a subrectangle having a first axis including the first range and a second axis including the second range, subdividing the subrectangle into subregions, each of the subregions having a first property, wherein a first step size along the first axis between successive ones of the first machine numbers is constant, and a second property, wherein a second step size along the second axis between successive ones of the second machine numbers is at least as large as the first step size, identifying one of the subregions, wherein an integer $k$ exists that satisfies a first inequality $(a'_z - \bar{a}_x - \bar{a}_y)/\Delta y \leq k \leq (b'_z - \bar{a}_x - \bar{a}_y)/\Delta y$, and wherein a machine number $\bar{x}$ exists that satisfies second and third inequalities $\bar{a}_x \leq \bar{x} \leq \bar{b}_x$, $a'_z - \bar{b}_y \leq \bar{x} \leq b'_z - \bar{a}_y$, choosing an integer $n$ with respect to the one subregion such that $(a'_z - \bar{x} - \bar{a}_y)/\Delta y \leq n \leq b'_z - \bar{x} - \bar{a}_y)/\Delta y$, and executing the arithmetic operation in the design verification system using the machine number $\bar{x}$ as the first input operand and a quantity $(\bar{a} + n\Delta y)$ as the second input operand, wherein $\bar{a}_x$ is a smallest one of the first machine numbers, $\bar{a}_y$ is a smallest one of the second machine numbers, $\bar{b}_x$ is a largest one of the first machine numbers, $\bar{b}_y$ is a largest one of the second machine numbers, $a'_z$ is the lower bound of the third range, $b'_z$ is the upper bound of the third range, and $\Delta y$ is the second step size.

According to a further aspect of the method, the subregions are subrectangles.

The invention provides a computer software product, including a computer-readable medium in which computer program instructions are stored, which instructions, when read by a computer, cause the computer to perform a method for generating a test case for submission to a design verification system. The test case includes a first input operand, a second input operand and a floating point arithmetic operation performed thereon to yield an output result. The method is carried out by defining a first range that contains a set of first machine numbers, defining a second range that contains a set of second machine numbers, defining a third range having a lower bound that is a result of a round operation on a minimum value of the output result, and having an upper bound that is a result of the round operation on a maximum value of the output result, wherein instances of the first input operand and the second input operand are in the first range and the second range, respectively. The method is further carried out by defining a subrectangle having a first axis including the first range and a second axis including the second range, subdividing the subrectangle into subregions, each of the subregions having a first property, wherein a first step size along the first axis between successive ones of the first machine numbers is constant, and a second property, wherein a second step size along the second axis between successive ones of the second machine numbers is at least as large as the first step size, identifying one of the subregions wherein an integer k exists that satisfies a first inequality $(a'_z-\bar{a}_x-\bar{a}_y)/\Delta y \leq k \leq (b'_z-\bar{a}_x-\bar{a}_y)/\Delta y$, and wherein a machine number $\bar{x}$ exists that satisfies second and third inequalities $\bar{a}_x \leq \bar{x} \leq \bar{b}_x$, $a'_z-\bar{b}_y \leq \bar{x} \leq b'_z-\bar{a}_y$, choosing an integer n with respect to the one subregion such that $(a'_z-\bar{x}-\bar{a}_y)/\Delta y \leq n \leq (b'_z-\bar{x}-\bar{a}_y)/\Delta y$, and executing the arithmetic operation in the design verification system using the machine number $\bar{x}$ as the first input operand and a quantity $(\bar{a}_y+n\,\Delta y)$ as the second input operand, wherein $\bar{a}_x$ is a smallest one of the first machine numbers, $\bar{a}_y$ is a smallest one of the second machine numbers, $\bar{b}_x$ is a largest one of the first machine numbers, $\bar{b}_y$ is a largest one of the second machine numbers, $a'_z$ is the lower bound of the third range, $b'_z$ is the upper bound of the third range, and $\Delta y$ is the second step size.

The invention provides a design verification system for an arithmetic floating point unit, including a processor adapted to execute a generator for generating a test case. The test case has a first input operand, a second input operand and a floating point arithmetic operation performed thereon to yield an output result, wherein the generator is operative to perform a method that includes defining a first range that contains a set of first machine numbers, defining a second range that contains a set of second machine numbers, defining a third range having a lower bound that is a result of a round operation on a minimum value of the output result, and an upper bound that is a result of the round operation on a maximum value of the output result, wherein instances of the first input operand and the second input operand are in the first range and the second range, respectively. The method is further carried out by defining a subrectangle has a first axis including the first range and a second axis including the second range, subdividing the subrectangle into subregions, each of the subregions has a first property, wherein a first step size along the first axis between successive ones of the first machine numbers is constant, and a second property, wherein a second step size along the second axis between successive ones of the second machine numbers is at least as large as the first step size, identifying one of the subregions wherein an integer k exists that satisfies a first inequality $(a'_z-\bar{a}_x-\bar{a}_y)/\Delta y \leq k \leq (b'_z-\bar{a}_x-\bar{a}_y)/\Delta y$, and where in a machine number $\bar{x}$ exists that satisfies second and third inequalities $\bar{a}_x \leq \bar{x} \leq \bar{b}_x$, $a'_z-\bar{b}_y \leq \bar{x} \leq b'_z-\bar{a}_y$, choosing an integer n with respect to the one subregion such that $(a'_z-\bar{x}-\bar{a}_y)/\Delta y \leq n \leq (b'_z-\bar{x}-\bar{a}_y)/\Delta y$. The processor is adapted to execute an execution engine for executing the test case, wherein the execution engine is operative to execute the arithmetic operation using the machine number $\bar{x}$ as the first input operand and a quantity $(\bar{a}_y+n\,\Delta y)$ as the second input operand, wherein $\bar{a}_x$ is a smallest one of the first machine numbers, $\bar{a}_y$ is a smallest one of the second machine numbers, $\bar{b}_x$ is a largest one of the first machine numbers, $\bar{b}_y$ is a largest one of the second machine numbers, $a'_z$ is the lower bound of the third range, $b'_z$ is the upper bound of the third range, and $\Delta y$ is the second step size.

The invention provides a design verification system for an arithmetic floating point unit, including a processor adapted to execute a generator for generating a test case. The test case including a first input operand, a second input operand and a floating point arithmetic operation performed thereon to yield an output result, wherein in a first mode of operation the generator is operative to perform a method that is carried out by defining a first range that contains a set of first machine numbers, defining a second range that contains a set of second machine numbers, defining a third range having a lower bound that is a result of a round operation on a minimum value of the output result, and an upper bound that is a result of the round operation on a maximum value of the output result, wherein instances of the first input operand and the second input operand are in the first range and the second range, respectively. The method is further carried out by selecting one of the first machine numbers, selecting one of the second machine numbers from a subset of the second range, performing the arithmetic operation using the selected first machine number and the selected second machine number to obtain the new output result, performing the round operation on the new output result to obtain a rounded output result, and determining that the rounded output result is within the third range, and wherein in a second mode of operation the generator is operative to perform a method that is carried out by defining a subrectangle having a first axis including the first range and a second axis including the second range, subdividing the subrectangle into subregions, each of the subregions having a first property, wherein a first step size along the first axis between successive ones of the first machine numbers is constant, and a second property, wherein a second step size along the second axis between successive ones of the second machine numbers is at least as large as the first step size, identifying one of the subregions wherein an integer k exists that satisfies a first inequality $(a'_z-\bar{a}_x-\bar{a}_y)/\Delta y \leq k \leq (b'_z-\bar{a}_x-\bar{a}_y)/\Delta y$, and wherein a machine number $\bar{x}$ exists that satisfies second and third inequalities $\bar{a}_x \leq \bar{x} \leq \bar{b}_x$, $a'_z-\bar{b}_y \leq \bar{x} \leq b'_z-\bar{a}_y$, and choosing an integer n with respect to the one subregion such that $(a'_z-\bar{x}-\bar{a}_y)/\Delta y \leq n \leq (b'_z-\bar{x}-\bar{a}_y)/\Delta y$. The processor is adapted to execute an execution engine for executing the test case, and wherein the execution engine is operative in the first mode of operation to execute the arithmetic operation using the selected first machine number and the selected second machine number as the first input operand and the second input operand, and in the second mode of operation the execution engine is operative to execute the arithmetic operation using the machine number $\bar{x}$ as the first input operand and a quantity $(\bar{a}_y+n\,\Delta y)$ as the second input operand, wherein $\bar{a}_x$ is a smallest one of the first machine numbers, $\bar{a}_y$ is a smallest one of the second machine numbers, $\bar{b}_x$ is a largest one of the first machine numbers, $\bar{b}_y$ is a largest one of the second machine numbers, $a'_z$ is the lower bound of the third range, $b'_z$ is the upper bound of the third range, and $\Delta y$ is the second step size.

A further aspect of the method includes verifying an existence of a second integer in the first subrectangle that satisfies a relation $(a'_z-\bar{a}_x-\bar{a}_y)/\Delta y \leq k \leq (b'_z-\bar{a}_x-\bar{a}_y)/\Delta y$, wherein k is the second integer, $\bar{a}_x$ is a smallest machine number of the first floating point input interval, $\bar{a}_y$ is a smallest machine number of the second floating point input interval, $I'_z$ is an interval defined by a set $\{z | \bar{a}_z \leq \text{round}(z) \leq \bar{b}_z\}$, $a'_z$ is a lower boundary of the interval $I'_z$, and $b'_z$ is an upper boundary of the interval $I'_z$, and $\Delta y$ is the second step size.

In one aspect of the method, the region also includes a second subrectangle. A third step size between the machine numbers in any third succession along the first axis is constant, and a fourth step size between the machine numbers in any fourth succession along the second axis is no less than the third step size.

The invention provides a computer software product, including a computer-readable medium in which computer program instructions are stored, which instructions, when read by a computer, cause the computer to perform a method for verifying a design of a floating point computation unit, which is carried out by receiving a definition of a floating point operation to test, the definition including a first floating point operand having a first floating point input interval and a second floating point operand having a second floating point input interval, and a floating point result having a floating point output interval. The input and output intervals have respective upper and lower floating point limits, whereby the first floating point input interval and the second floating point input interval define a region in an operand plane having a first and second axes corresponding respectively to the first floating point operand and the second floating point operand. The method is further carried out by dividing the region into subrectangles, each of the subrectangles having respective bounds, such that within at least a first subrectangle, a first step size between machine numbers in any first succession along the second axis is constant, and a second step size between the machine numbers in any second succession along the first axis is no less than the first step size. The method is further carried out by defining a reduced interval for the first floating point operand responsively to the upper and lower floating point limits of the second floating point input interval and the floating point output interval, selecting a first machine number in the reduced interval, defining an integer range responsively to the respective bounds of the first subrectangle, to the first machine number, and to the first step size, selecting an integer within the integer range, determining a second machine number responsively to the integer and to the first step size, and testing the floating point operation in the design using the first machine number and the second machine number as the first floating point operand and the second floating point operand.

The invention provides a design verification system for a floating point computation unit, including a processor adapted to execute a generator that receives a definition of a floating point operation to test, the definition including a first floating point operand having a first floating point input interval, a second floating point operand having a second floating point input interval, and a floating point result has a floating point output interval. The input and output intervals have respective upper and lower floating point limits, whereby the first floating point input interval and the second floating point input interval define a region in an operand plane having a first second axes corresponding respectively to the first floating point operand and the second floating point operand. The generator is operative to carry out a method comprising dividing the region into subrectangles, each of the subrectangles having respective bounds, such that within at least a first subrectangle, a first step size between machine numbers in any first succession along the second axis is constant, and a second step size between the machine numbers in any second succession along the first axis is no less than the first step size. The method is further carried out by defining a reduced interval for the first floating point operand responsively to the upper and lower floating point limits of the second floating point input interval and the floating point output interval, selecting a first machine number in the reduced interval, defining an integer range responsively to the respective bounds of the first subrectangle, to the first machine number, and to the first step size, selecting an integer within the integer range, determining a second machine number responsively to the integer and to the first step size. The processor is adapted to execute an execution engine for executing the floating point operation to test the floating point computation unit using the first machine number and the second machine number as the first floating point operand and the second floating point operand.

The invention provides a method for generating a test case in a design verification system, the test case including a first input operand, a second input operand and a floating point arithmetic operation performed thereon to yield an output result. The method is carried out by defining a first range that contains a set of first machine numbers, defining a second range that contains a set of second machine numbers, defining a third range having a lower bound that is a result of a round operation on a minimum value of the output result, and having an upper bound that is a result of the round operation on a maximum value of the output result, wherein instances of the first input operand and the second input operand are in the first range and the second range, respectively. The method is further carried out by defining a subrectangle having a first axis including the first range and a second axis including the second range, subdividing the subrectangle into subregions, each of the subregions having a first property, wherein a first step size along the first axis between successive ones of the first machine numbers is constant, and a second property, wherein a second step size along the second axis between successive ones of the second machine numbers is at least as large as the first step size, identifying one of the subregions wherein an integer k exists that satisfies a first inequality $(a'_z - \bar{a}_z - \bar{a}_y)/\Delta y \le k \le (b'_z - \bar{a}_x - \bar{a}_y)/\Delta y$, and wherein a machine number $\bar{x}$ exists that satisfies second and third inequalities $\bar{a}_x \le \bar{x} \le \bar{b}_x$, $a'_z - \bar{b}_y \le \bar{x} \le b'_z - \bar{a}_y$, choosing an integer n with respect to the one subregion such that $(a'_z - \bar{x} - \bar{a}_y)/\Delta y \le n \le (b'_z - \bar{x} - \bar{a}_y)/\Delta y$, and executing the arithmetic operation in the design verification system using the machine number $\bar{x}$ as the first input operand and a quantity $(\bar{a}_y + n\,\Delta y)$ as the second input operand, wherein $\bar{a}_x$ is a smallest one of the first machine numbers, $\bar{a}_y$ is a smallest one of the second machine numbers, $\bar{b}_x$ is a largest one of the first machine numbers, $\bar{b}_y$ is a largest one of the second machine numbers, $a'_z$ is the lower bound of the third range, $b'_z$ is the upper bound of the third range, and $\Delta y$ is the second step size. According to a further aspect of the method, the subregions are subrectangles.

The invention provides a computer software product, including a computer-readable medium in which computer program instructions are stored, which instructions, when read by a computer, cause the computer to perform a method for generating a test case for submission to a design verification system. The test case includes a first input operand, a second input operand and a floating point arithmetic operation performed thereon to yield an output result. The method is carried out by defining a first range that contains a set of first machine numbers, defining a second range that contains a set of second machine numbers, defining a third range having a lower bound that is a result of a round operation on a minimum value of the output result, and having an upper bound that is a result of the round operation on a maximum value of the output result, wherein instances of the first input operand and the second input operand are in the first range and the second range, respectively. The method is further carried out by defining a subrectangle having a first axis including the first range and a second axis including the second range, subdividing the subrectangle into subregions, each of the subregions having a first property, wherein a first step size along the first axis between successive ones of the first machine numbers is constant, and a second property, wherein a second step size along the second axis between successive ones of the second machine numbers is at least as large as the first step size, identifying one of the subregions wherein an integer k exists that satisfies a first inequality $(a'_z-\bar{a}_x-\bar{a}_y)/\Delta y \le k \le (b'_z-\bar{a}_x-\bar{a}_y)/\Delta y$, and wherein a machine number $\bar{x}$ exists that satisfies second and third inequalities $\bar{a}_x \le \bar{x} \le \bar{b}_x$, $a'_z-\bar{b}_y \le \bar{x} \le b'_z-\bar{a}_y$, choosing an integer n with respect to the one subregion such that $(a'-\bar{x}-\bar{a}_y)/\Delta y \le n \le (b'_z-\bar{x}-\bar{a}_y)/\Delta y$, and executing the arithmetic operation in the design verification system using the machine number $\bar{x}$ as the first input operand and a quantity ($\bar{a}_y+n\,\Delta y$) as the second input operand, wherein $\bar{a}_x$ is a smallest one of the first machine numbers, $\bar{a}_y$ is a smallest one of the second machine numbers, $\bar{b}_x$ is a largest one of the first machine numbers, $\bar{b}_y$ is a largest one of the second machine numbers, $a'_z$ is the lower bound of the third range, $b'_z$ is the upper bound of the third range, and $\Delta y$ is the second step size.

The invention provides a design verification system for an arithmetic floating point unit, including a processor adapted to execute a generator for generating a test case. The test case has a first input operand, a second input operand and a floating point arithmetic operation performed thereon to yield an output result, wherein the generator is operative to perform a method that includes defining a first range that contains a set of first machine numbers, defining a second range that contains a set of second machine numbers, defining a third range having a lower bound that is a result of a round operation on a minimum value of the output result, and an upper bound that is a result of the round operation on a maximum value of the output result, wherein instances of the first input operand and the second input operand are in the first range and the second range, respectively. The method is further carried out by defining a subrectangle has a first axis including the first range and a second axis including the second range, subdividing the subrectangle into subregions, each of the subregions has a first property, wherein a first step size along the first axis between successive ones of the first machine numbers is constant, and a second property, wherein a second step size along the second axis between successive ones of the second machine numbers is at least as large as the first step size, identifying one of the subregions wherein an integer k exists that satisfies a first inequality $(a'_z-\bar{a}_x-\bar{a}_y)/\Delta y \le k \le (b'_z-\bar{a}_x-\bar{a}_y)/\Delta y$, and wherein a machine number $\bar{x}$ exists that satisfies second and third inequalities $\bar{a}_x \le \bar{x} \le \bar{b}_x$, $a'_z-\bar{b}_y \le \bar{x} \le b'_z-\bar{a}_y$, choosing an integer n with respect to the one subregion such that $(a'_z-\bar{x}-\bar{a}_y)/\Delta y \le n \le (b'-\bar{x}-\bar{a}_y)/\Delta y$. The processor is adapted to execute an execution engine for executing the test case, wherein the execution engine is operative to execute the arithmetic operation using the machine number $\bar{x}$ as the first input operand and a quantity ($\bar{a}_y+n\,\Delta y$) as the second input operand, wherein $\bar{a}_x$ is a smallest one of the first machine numbers, $\bar{a}_y$ is a smallest one of the second machine numbers, $\bar{b}_x$ is a largest one of the first machine numbers, $\bar{b}_y$ is a largest one of the second machine numbers, $a'_z$ is the lower bound of the third range, $b'_z$ is the upper bound of the third range, and $\Delta y$ is the second step size.

The invention provides a design verification system for an arithmetic floating point unit, including a processor adapted to execute a generator for generating a test case. The test case including a first input operand, a second input operand and a floating point arithmetic operation performed thereon to yield an output result, wherein in a first mode of operation the generator is operative to perform a method that is carried out by defining a first range that contains a set of first machine numbers, defining a second range that contains a set of second machine numbers, defining a third range having a lower bound that is a result of a round operation on a minimum value of the output result, and an upper bound that is a result of the round operation on a maximum value of the output result, wherein instances of the first input operand and the second input operand are in the first range and the second range, respectively. The method is further carried out by selecting one of the first machine numbers, selecting one of the second machine numbers from a subset of the second range, performing the arithmetic operation using the selected first machine number and the selected second machine number to obtain the new output result, performing the round operation on the new output result to obtain a rounded output result, and determining that the rounded output result is within the third range, and wherein in a second mode of operation the generator is operative to perform a method that is carried out by defining a subrectangle having a first axis including the first range and a second axis including the second range, subdividing the subrectangle into subregions, each of the subregions having a first property, wherein a first step size along the first axis between successive ones of the first machine numbers is constant, and a second property, wherein a second step size along the second axis between successive ones of the second machine numbers is at least as large as the first step size, identifying one of the subregions wherein an integer k exists that satisfies a first inequality $(a'_z-\bar{a}_x-\bar{a}_y)/\Delta y \le k \le (b'_z-\bar{a}_x-\bar{a}_y)/\Delta y$, and wherein a machine number $\bar{x}$ exists that satisfies second and third inequalities $\bar{a}_x \le \bar{x} \le \bar{b}_x$, $a'_z-\bar{b}_y \le \bar{x} \le b'_z-\bar{a}_y$, and choosing an integer n with respect to the one subregion such that $(a'_z-\bar{x}-\bar{a}_y)/\Delta y \le n \le (b'_z-\bar{x}-\bar{a}_y)/\Delta y$. The processor is adapted to execute an execution engine for executing the test case, wherein the execution engine is operative in the first mode of operation to execute the arithmetic operation using the selected first machine number and the selected second machine number as the first input operand and the second input operand, and in the second mode of operation the execution engine is operative to execute the arithmetic operation using the machine number $\bar{x}$ as the first input operand and a quantity ($\bar{a}_y+n\,\Delta y$) as the second input operand, wherein $\bar{a}_x$ is a smallest one of the first machine numbers, $\bar{a}_y$ is a smallest one of the second machine numbers, $\bar{b}_x$ is a largest one of the first machine numbers, $\bar{b}_y$ is a largest one of the second machine numbers, $a'_z$ is the lower bound of the third range, $b'_z$ the upper bound of the third range, and $\Delta y$ is the second step size.

Turning now to the drawings, reference is made to FIG. 1, which is a block diagram of a verification system that is operable in accordance with a disclosed embodiment of the invention. A generic verification system 10, used for verifying a software or hardware implementation of an arithmetic floating point unit, has several basic interacting components. Those components of the verification system 10 that are located above a broken line 11 are dependent on the specification of the implementation being verified, while those located below the line 11 are independent of the specification. The principles of the invention can be applied to many different verification systems and test generator engines, including verification systems in which the components above the line 11 are not present. Components of the verification system 10 can be realized as above-noted floating point test generator FPgen, or the system disclosed in commonly assigned application Ser. No. 09/859,250 (Publication No. 2002/0002698) and application Ser. No. 10/078,111 (Publication No. 2003/0200244), the disclosures of which are herein incorporated by reference.

The verification system 10 enables the creation of tests that have various degrees of randomness. The ability of the verification system 10 to introduce random unspecified values is fundamental, since design flaws in practice are usually unpredictable. However, the verification system 10 typically contains provisions for biasing the tests toward conditions of interest, for example boundary conditions, or specific byte alignments.

An optional abstract behavioral model 14 holds a formal description of the specification of the system. This specification may be stored in a database, which may also incorporate testing knowledge of the system design (in our system these may be testing constraints and coverage criteria). The integration of all the information stored in the behavioral model 14 is referred to herein as the knowledge base of the verification system 10. The principles of the invention can also be applied in verification systems that are not model based, and lack the behavioral model 14.

A generic test generator engine 22 has a user input 20, which influences the test generator engine 22. The influence of the input 20 includes, for example, the identity of the test instructions, their relative order, and various events relating to the instructions.

An optional behavioral simulator 26 may be constructed by the test generator from the behavioral model 14 by the test generator engine 22. This construction can be performed "on-the-fly", or as a separate off-line procedure. In either case, the behavioral simulator 26 is transparent to the user. In embodiments in which the behavioral simulator 26 is present, it is used to develop the behavioral model 14, and to predict the results of instruction execution in accordance with the specification of the system being verified.

The test generator engine 22 may also receive some generic knowledge of the design specification, and can exploit this knowledge so as to generate sequences of instructions to form the test cases 30. The test cases 30 are executed by an execution engine 12 on an implementation of the system under test. The system can be a complex software implemented system, or a hardware simulator. Indeed, the system itself may be a simulator.

Execution of the test cases 30 produces a response 34 from the system. The response 34 is submitted to a validation engine 36, which has knowledge of the expected response, validates the response 34, and produces validation results 38.

Figure 2:
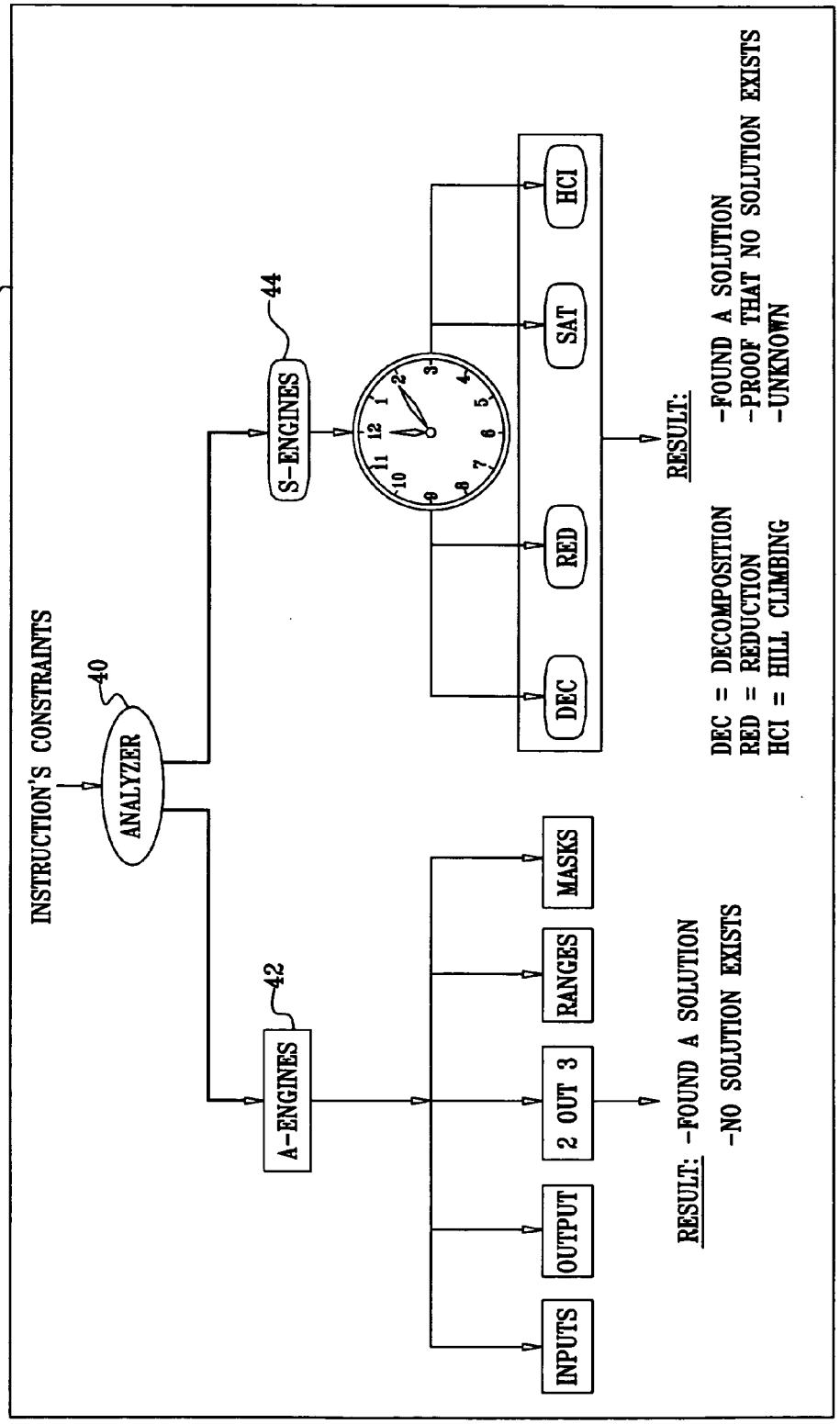
FIG. 2 is a detailed block diagram of an embodiment of a test generator engine in the verification system shown in FIG. 1, which is constructed and operative in accordance with a disclosed embodiment of the invention.

Reference is now made to FIG. 2, which is a more detailed block diagram of an embodiment of the test generator engine 22 (FIG. 1) that is constructed and operative in accordance with a disclosed embodiment of the invention. The embodiment of FIG. 2 is realized as the above-noted floating point test generator FPgen, details of which are modified so as to apply the principles of the instant invention.

The test generator engine 22 provides test cases in which the operands comply with constraints that emanate from set restrictions on instruction operands. Given a restriction, the test generator engine 22 is tuned to search for a random instance that will solve it, such that the set of random instances thus found is uniformly distributed among the set of all solutions. For some complex cases, the uniformity target is dropped and, at the very least, it is ensured that each solution has a reasonable probability of being selected. As noted above, constraints can be given on input operands, output results, or on both types simultaneously.

Clearly, solving constraints on output results, as opposed to input operands, leads to a significant leap in the complexity of the problem, as it involves the semantics of the instruction.

After first analyzing the constraint type using an analyzer 40, the task is directed to the appropriate solution engine or group of engines. Two major groups of engines are used:

A-engines 42 are analytic engines guaranteed to find a solution of the constraint within a reasonable time, if it exists. Therefore, their output is either a random instance of a solution, or a message that no solution exists. These analytic engines are based on mathematical algorithms for tractable, albeit often complex, problems, and can deal with mask-constraints as well as range-constraints. According to the instant invention, algorithms disclosed hereinbelow are applied by the A-engines 42 to find solutions in which the constraints are ranges. These algorithms may be programmed as software instructions or implemented in hardware using programming methods known to the art.

S-engines 44 are shown in FIG. 2 are briefly described for purposes of completeness. They are used on constraints for which no A-engine is known. The S-engines 44 are dedicated to constraints for which A-engines are not always available. Typically, the S-engines 44 have heuristic search solutions, but their success within a reasonable amount of time is not guaranteed. For example, the S-engines 44 could use hill-climbing or simulated annealing techniques within a search space. The output can include a "quit" message, indicating that no solution has been found, although one may exist.

Problem Definition.

Given three ranges of floating point numbers Rx, Ry, Rz, a floating point operation (op), and a rounding-mode (round), three floating point numbers $\bar{x}$, $\bar{y}$, $\bar{z}$ are to be generated such that $\bar{x} \in R_x$, $\bar{y} \in R_y$, $\bar{z} \in R_z$, and $\bar{z} = $round ($\bar{x}$ op $\bar{y}$). In other words, given a floating point operation op $\in$ {add, subtract}, a rounding mode round $\in$ {to-zero, to-positive-infinity, to-negative-infinity, to-nearest}, and three ranges Rx, Ry, Rz of floating point numbers, three random floating point numbers are produced, $\bar{x}$, $\bar{y}$, $\bar{z}$, such that $\bar{x} \in Rx$, $\bar{y} \in Ry$, $\bar{z} \in Rz$, and $\bar{z} = $round ($\bar{x}$ op $\bar{y}$).

The difficulty in solving range constraints stems from the fact that although a floating-point range appears to be a continuous set of numbers, each range is in fact a set of discrete machine numbers. To illustrate this, consider two floating point numbers x$\in$Rx and $\bar{z}\in$Rz. It is quite possible that there exists a real number y, in the real interval defined by the endpoints of Ry, for which round ($\bar{x}-y$)=$\bar{z}$, but that there does not exist such a machine number.

Two algorithms are presented for solving this problem, a continuous algorithm and a discrete algorithm. The continuous algorithm is based on the similarity between the problem discussed here, and the problem of finding such a solution when the ranges are real number intervals. In the case of real numbers, the problem is relatively simple: the intervals are reduced and a solution is found by using the inverse of the required operation. For machine numbers, it is not possible to use the inverse operation. Therefore, the continuous algorithm differs from the real number algorithm. As is shown hereinbelow, the continuous algorithm is very efficient for most cases.

The discrete algorithm is slower than the continuous algorithm. However, if a solution exists, this algorithm will find it. Therefore, it is recommended to run the continuous algorithm initially. If this algorithm does not terminate within a reasonable amount of time, then the discrete algorithm is used.

In general, the discussion herein focuses on a solution for IEEE 754 sets of floating-point numbers. However, the algorithms can easily be converted to non-IEEE rounding modes (such as round half down), and most of the results are valid for any floating point format, such as decimal floating point. Decimal floating point is described in the document A Decimal Floating Point Specification, M. Cowlishaw, E. Schwarz, R. Smith, and C. Webb, Proc. IEEE 15th Symp. Computer-Arithmetic (ARITH15), pages 147-154, 2001.

The problems for addition and subtraction are actually equivalent, because $\bar{y}$ may be replaced by $-\bar{y}$. Hence, subtraction is not discussed further herein.

The Continuous Algorithm.
Eliminating the Round Operation.

Define the set: $I'_z=\{z|\bar{a}_z\leq \text{round}(z)\leq \bar{b}_z\}$. Obviously $I'_z$ is an interval, and $[\bar{a}_z, \bar{b}_z] \subset I'_z$. Denote the end points of $I'_z$ by $a'_z$, $b'_z$.

Clearly $a'_z\leq \bar{a}_z\leq \bar{b}_z\leq b'_z$, $a'_z<b'_z$, and $I'_z$ is one of the intervals $(a'_z, b'_z)$, $[a'_z, b'_z)$, $(a'_z, b'_z]$, $[a'_z, b'_z]$, depending on $\bar{a}_z, \bar{b}_z$, and on the rounding mode. The problem can now be reformulated as follows: Find two machine numbers $\bar{x}$, $\bar{y}$ such that $\bar{a}_x\leq\bar{x}\leq\bar{b}_x$, $\bar{a}_y\leq\bar{y}\leq\bar{b}_y$, and $\bar{x}+\bar{y}\in I'_z$.

The set of all real number pairs that solve the above inequalities is defined as follows:

$$A_{x,y}=\{(x,y)|\bar{a}_x\leq x\leq \bar{b}_x, \bar{a}_y\leq \bar{b}_y, x+y\in I'_z\}. \quad (1)$$

Figure 3:
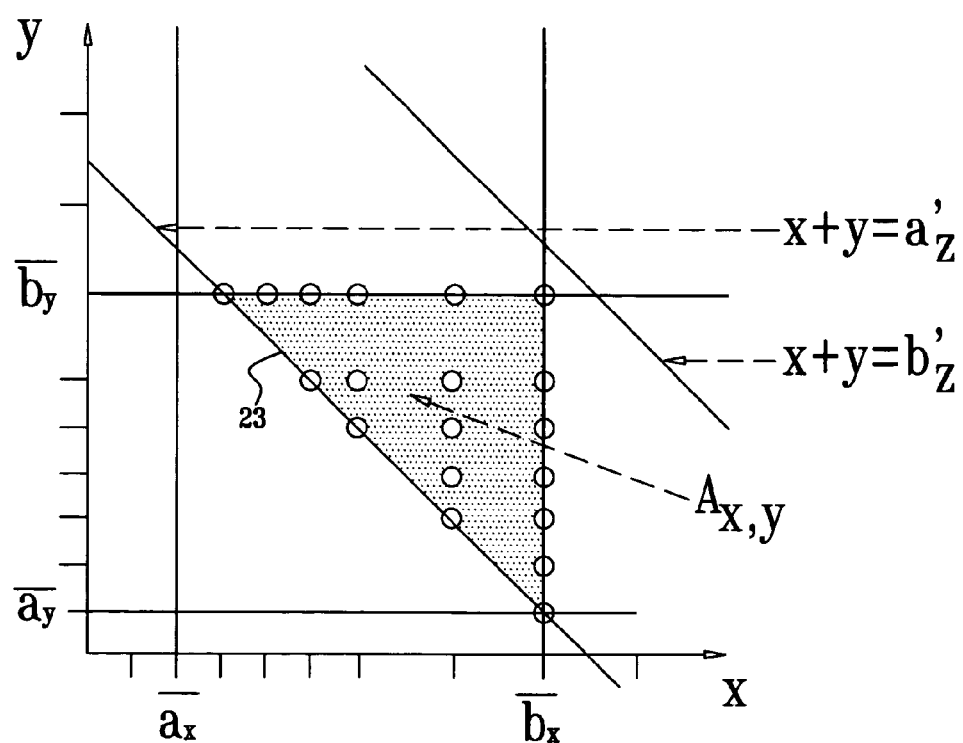
FIG. 3 is a graphical illustration of a set of solutions for an addition test case in accordance with a disclosed embodiment of the invention.

The set of all solutions to this problem is the subset of $A_{x,y}$, which includes all the pairs in which x and y are machine numbers. Reference is now made to FIG. 3, which is a graphical illustration of a set of solutions for addition in accordance with a disclosed embodiment of the invention. Black dots within and at the boundaries of a triangle 46 represent individual solutions.

Reducing the Input Intervals.

There are cases in which some of the intervals $[\bar{a}_x, \bar{b}_x]$, $[\bar{a}_y, \bar{b}_y]$, and $I'_z$ can be reduced to smaller intervals, such that the problems remain equivalent. By equivalent, it is meant that the set $A_{x,y}$ is the same for both sets of intervals. The reduction is performed as follows:

For the addition (+) operation and $I'_z[a'_z, b'_z]$, and for every $(x, y)\in A_{x,y}$:

$$\bar{a}_x\leq x\leq \bar{b}_x, \bar{a}_y\leq y\geq \bar{b}_y, a'_z\leq x+y\leq b'_z.$$

In other words, $$a'_z-y\leq x\leq b'_z-y, a'_z-x\leq y\leq b'_z-x.$$

The two relations given above imply that $$a'_z-\bar{b}_y\leq x\leq b'_z-\bar{a}_y, a'_z-\bar{b}_x\leq y\leq b'_z-\bar{a}_x.$$

Combining this with the original boundaries on x and y from Equation 1, new boundaries are obtained on x, y, and x+y, which are denoted by $A_x, B_x, A_y, B_y, A_z, B_z$:

$$A_x=\max\{\bar{a}_x, a'_z-\bar{b}_y\}\leq x\leq \min\{\bar{b}_x, b'_z-\bar{a}_y\}=B_x$$

$$A_y=\max\{\bar{a}_y, a'_z\bar{b}_x\}\leq y\leq \min\{\bar{b}_y, b'_z-\bar{a}_x\}=B_y$$

$$A_z=\max\{a'_z, \bar{a}_x+\bar{a}_y\}\leq x+y\leq \min\{b'_z, \bar{b}_x+\bar{b}_y\}B_z.$$

It was assumed that $I'_z=[a'_z, b'_z]$. However, if $I'_z=(a'_z, b'_z]$ or $[a'_z, b'_z)$ or $(a'_z, b'_z)$, some of the $\leq$ relations need to be replaced by < relations. Apart from this, the results would be identical. The results can be summarized in the following way: For the + operation, $$A_{x,y}=\{(x,y)|x\in I_x, y\in I_y, z=x+y\in I_z\},$$

where $I_x, I_y, I_z$ are intervals (each end point of which is either closed or open) with the end points: $A_x, B_x, A_y, B_y, A_z$, and $B_z$, as described above.

At this point the intervals $I_x, I_y, I_z$ cannot be reduced any further. A proof of this proposition is given in Appendix 1.

Finding a Random Solution Using the Continuous Algorithm.

Reference is now made to FIG. 4, which is a flow chart illustrating a method of generating range-constrained floating point numbers in accordance with a disclosed embodiment of the invention. The notation presented in the description of FIG. 4 has the same meaning as presented earlier.

The procedure begins at initial step 48. The notation given and input intervals are chosen as described above with reference to FIG. 3.

Control passes immediately to decision step 50, where a determination is made whether at least one machine number in the interval $\bar{x}\in I_x$ exists. If the determination at decision step 50 is negative, then control proceeds to final step 52. In this case, one can be sure that no solution exists. The procedure terminates in failure.

If the determination at decision step 50 is affirmative, then control proceeds to step 54. A random machine number $\bar{x}\in I_x$ is chosen.

Next, at decision step 56 a determination is made whether at least one random machine number $\bar{y}$ in the interval [max{$\bar{a}_y, a'_z-\bar{x}$}, min{$\bar{b}_y, b'_z-\bar{x}$}] exists.

If the determination at decision step 56 is negative, then control returns to step 54 to execute a new iteration using another random machine number $\bar{x}$.

If the determination at decision step 56 is affirmative, then control proceeds to step 58. A number $\bar{y}$ is chosen.

Next, at step 60, the value of round($\bar{x}+\bar{y}$) is determined using the values chosen in step 54 and step 58.

Next, at decision step 62, it is determined whether the value obtained in step 60 falls within the range $\bar{a}_z\leq \text{round}(\bar{x}+\bar{y})\leq \bar{b}_z$, using the input parameters selected at initial step 48.

If the determination at decision step 62 is negative, then control returns to step 54.

If the determination at decision step 62 is affirmative, then the result $(\bar{x}, \bar{y})$ is returned at final step 64 for use as a test case of floating point addition in a design verification system. The method terminates successfully.

This method is very efficient if the projections of the machine number solutions onto the x, y and z axes give sets, which are each dense in $I_x, I_y$ and $I_z$ respectively. At the other extreme, when the density of the machine numbers is relatively small, the algorithm may work for an unacceptably long interval of time. In the following section, another embodiment of the invention is disclosed, which addresses this problem. Although the embodiments described above relate specifically to addition and subtraction operations, the continuous algorithm may also be extended to finding test cases for other floating point arithmetic operations, such as multiplication and division.

The Discrete Algorithm for the +Operation

There are some cases in which the continuous algorithm disclosed above, applied to the + operation, does not work efficiently. This occurs, for example, when there is a significant cancellation of bits; that is, when the exponent of the result is smaller than the input exponents. This point can be appreciated by an example using binary floating-point numbers with a three bit significand: $\bar{a}_x=(1.00)_2, \bar{b}_x=(1.11)_2, \bar{a}_y=-(1.11)_2, \bar{b}_y=-(1.00)_2, \bar{a}_z=(0.00101)_2, \bar{b}_z=(0.00111)_2$, using round-to-nearest mode. Clearly, the set $A_{x,y}$ (FIG. 3) in this example, is not empty. Yet, there is no solution of machine numbers.

When the set of solutions is sparse on the z axis in the vicinity of the interval $[\bar{a}_z, \bar{b}_z]$, in general the continuous algorithm cannot detect whether such a solution exists.

The inventor has discovered a different algorithm for addition, which solves these difficult cases as well. The focus of this algorithm is a search for a solution within a subspace of the (x, y) plane. More specifically, the algorithm described below works in cases in which the rectangle $$R=[\bar{a}_x, \bar{b}_x]\times[\bar{a}_y, \bar{b}_y]$$

has the following properties:

Property 1: The step size, $\Delta y$, between successive machine numbers along the y-axis, is constant throughout the rectangle.

Property 2: The step size, $\Delta x$, between successive machine numbers along the x-axis, may vary within the rectangle, but is always at least the size of $\Delta y$.

The conditions on x and y are interchangeable. In order to make use of this algorithm, the original rectangle R, which contains all the solution pairs, is divided into subrectangles, each of which has the above-described properties. A method for efficiently partitioning the original rectangle is described hereinbelow.

In an extreme case, the original rectangle may include all of the pairs of floating-point numbers (both positive and negative). In such a case, the number of subrectangles will be approximately $8(E_{max}-E_{min})$, which is close to 16,000 for IEEE double precision. This algorithm is therefore slower than the continuous algorithm described above. Hence, it is recommended to use the continuous algorithm first, and if it does not find a solution within a reasonable amount of time, then to use the discrete algorithm.

A theoretical framework underlying the discrete algorithm is presented in Appendix 2 in order to show a necessary and sufficient condition for the existence of a solution.

The Discrete Algorithm.

Reference is now made to FIG. 5, which is a flow chart illustrating a method of generating range-constrained floating point numbers in accordance with an alternate embodiment of the invention. The method applies Theorem 1. At initial step 66 input intervals are chosen as described above with reference to FIG. 3, and an original region in an operand plane, a rectangle R, is defined by the x and y range limits.

Next, at step 68, because Theorem 1 assumes the above-noted Properties (1) and (2), the rectangle R is divided into subregions, which in a current embodiment are subrectangles, each of which either has these properties, or has these properties with x and y interchanged. Methods for accomplishing the partition of the rectangle R are disclosed below.

Next, at decision step 70 it is determined if there are subrectangles remaining to be processed.

If the determination at decision step 70 is negative, then control proceeds to final step 72. The procedure terminates in failure.

If the determination at decision step 70 is affirmative, then control proceeds to step 74. One of the subrectangles defined in step 68 is selected at random.

Next, at decision step 76, using the parameters of the current subrectangle, it is determined whether an integer k exists, which satisfies the inequality $$(a'_z - \bar{a}_x - \bar{a}_y)/\Delta y \leq k \leq (b'_z - \bar{a}_x - \bar{a}_y)/\Delta y.$$

If the determination at decision step 76 is negative, then no solution exists with respect to the current subrectangle. Control returns to decision step 70 to begin a new iteration with a different subrectangle.

If the determination at decision step 76 is affirmative, then control proceeds to decision step 78, where it is determined whether in the current subrectangle a machine number 2 exists that satisfies the inequality $$\bar{a}_x \leq \bar{x} \leq \bar{b}_x, a'_z - \bar{b}_y, \bar{x} \leq b'_z - \bar{a}_y,$$

which is equivalent to the condition $\bar{x} \in I_x$. The number $\bar{x}$ may be selected randomly or systematically within the current subrectangle.

If the determination at decision step 78 is negative, then no solution exists with respect to the current subrectangle. Control returns to decision step 70.

If the determination at decision step 78 is affirmative, then control proceeds to step 80. An integer n (which is guaranteed to exist) satisfying the conditions $$(a'_z \bar{x} - \bar{a}_y)/\Delta y \leq n \leq (b'_z - x - \bar{a}_y)/\Delta y \; n=0,1,\ldots,N, N=(\bar{b}_y - \bar{a}_y)/\Delta y$$

is chosen. In some embodiments, the choice is made randomly. Alternatively, the integer can be chosen systematically, for example, according to any suitable search algorithm.

Control now proceeds to final step 82, where a solution ($\bar{x}$, $\bar{a}_y + n\Delta y$) is returned. The procedure terminates successfully.

Partitioning the Original Ranges into Subrectangles

Several different methods can be used to partition the original rectangle into subrectangles. In the simplest method, each subrectangle includes exactly one exponent for both x and y. Using this method, in the worst case, we get approximately $4(E_{max}-E_{min})^2$ rectangles, which is around 16,000,000 for double precision. Therefore, this solution is impractical.

The following method generates, in the worst case, approximately $8(E_{max}-E_{min})$ subrectangles, which is around 16,000 for double precision. For each exponent, E, we define the following two rectangles:

1. The exponent of y is E and the exponent of $x \leq E$.
2. The exponent of x is E and the exponent of $y > E$.

Figure 6:
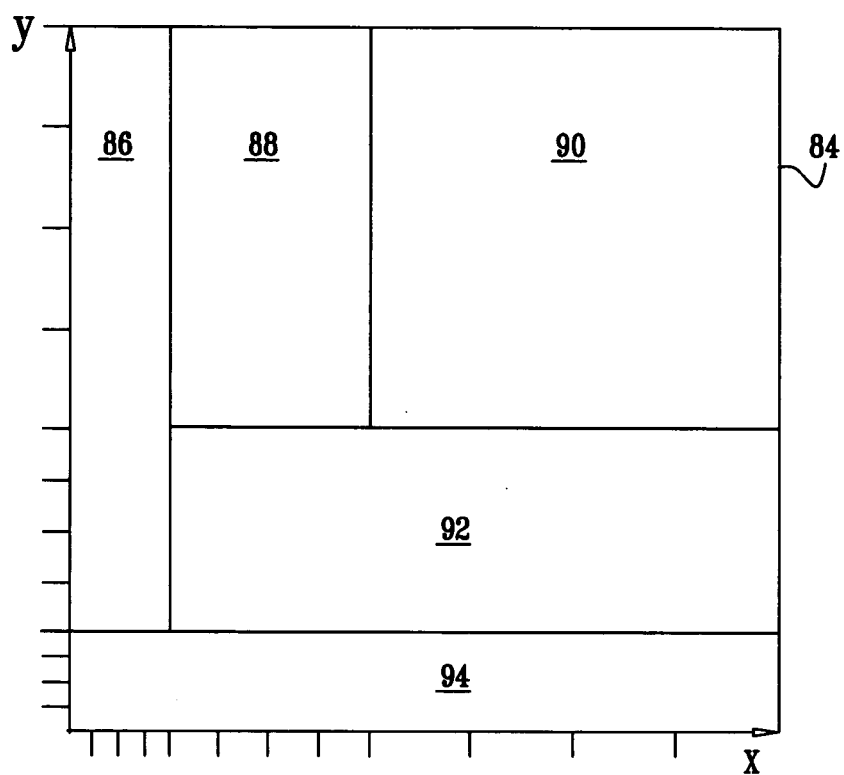
FIG. 6 illustrates a partition of the first quadrant of a rectangle into subrectangles for use in the method shown in FIG. 5.

For each quadrant of the rectangle, there are about 2 $(E_{max}-E_{min})$ subrectangles. Because, in the worst case, we must define these rectangles for each quadrant of the plane, in total we get about $8(E_{max}-E_{min})$. Reference is now made to FIG. 6, which illustrates a partition of the first quadrant of a rectangle 84 into five subrectangles 86, 88, 90, 92, 94.

It will thus be appreciated by persons skilled in the art that the present invention is not limited to what has been particularly shown and described hereinabove. Rather, the scope of the present invention includes both combinations and sub-combinations of the various features described hereinabove, as well as variations and modifications thereof that are not in the prior art, which would occur to persons skilled in the art upon reading the foregoing description.

Variations described for the present invention can be realized in any combination desirable for each particular application. Thus particular limitations, and/or embodiment enhancements described herein, which may have particular advantages to the particular application need not be used for all applications. Also, not all limitations need be implemented in methods, systems and/or apparatus including one or more concepts of the present invention. The invention also includes apparatus for implementing steps of method of this invention.

The present invention can be realized in hardware, software, or a combination of hardware and software. A visualization tool according to the present invention can be realized in a centralized fashion in one computer system, or in a distributed fashion where different elements are spread across several interconnected computer systems. Any kind of computer system—or other apparatus adapted for carrying out the methods and/or functions described herein—is suitable. A typical combination of hardware and software could be a general purpose computer system with a computer program that, when being loaded and executed, controls the computer system such that it carries out the methods described herein. The present invention can also be embedded in a computer program product, which comprises all the features enabling the implementation of the methods described herein, and which—when loaded in a computer system—is able to carry out these methods.

Computer program means or computer program in the present context include any expression, in any language, code or notation, of a set of instructions intended to cause a system having an information processing capability to perform a particular function either directly or after conversion to another language, code or notation, and/or reproduction in a different material form.

Thus the invention includes an article of manufacture which comprises a computer usable medium having computer readable program code means embodied therein for causing a function described above. The computer readable program code means in the article of manufacture comprises computer readable program code means for causing a computer to effect the steps of a method of this invention. Similarly, the present invention may be implemented as a computer program product comprising a computer usable medium having computer readable program code means embodied therein for causing a function described above. The computer readable program code means in the computer program product comprising computer readable program code means for causing a computer to effect one or more functions of this invention. Furthermore, the present invention may be implemented as a program storage device readable by machine, tangibly embodying a program of instructions executable by the machine to perform method steps for causing one or more functions of this invention.

It is noted that the foregoing has outlined some of the more pertinent objects and embodiments of the present invention. This invention may be used for many applications. Thus, although the description is made for particular arrangements and methods, the intent and concept of the invention is suitable and applicable to other arrangements and applications. It will be clear to those skilled in the art that modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art.

APPENDIX 1

Proof that the Intervals $I_x$, $I_y$, $I_x$ Cannot be Reduced any Further.

It suffices to show that for every $A_x < x < B_x$, there exists a number y, such that $(x, y) \in A_{x,y}$. The same is true for every $A_y < y < B_y$ and for every $A_z < z < B_z$. We shall prove this for every $A_x < x < B_x$, with the + operation. The rest of the cases have similar proofs.

Proof: Consider any number x, such that $A_x < x < B_x$. From the definitions of $A_x$, $B_x$, we deduce that $a'_z - \overline{b}_y < x < b'_z - \overline{a}_y$.

Consider now the expression z−y. The left hand side of the above double inequality is equal to z−y with $z = a'_z$, $y = \overline{b}_y$. The right hand side is equal to the same expression with $z = b'_z$, $y = \overline{a}_y$. Therefore, by changing (y, z) continuously, from $(a'_z, \overline{b}_y)$ to $(b'_z, \overline{a}_y)$, we deduce the existence of intermediate values of y and z, such that z−y=x (or z=x+y) exactly. For these values of y and z, we have, $\overline{a}_y < y < \overline{b}_y$, $a'_z < x + y < b'_z$. Obviously, $\overline{a}_x < x < \overline{b}_x$. Therefore, $(x, y) \in A_{x,y}$.

APPENDIX 2

Theoretical Framework for the Discrete Algorithm.
Interval Lemmas.

Lemma 1. Given two intervals $[a_1, b_1]$, $[a_2, b_2]$, the condition $[a_1, b_1] \cap [a_2, b_2] \neq \emptyset$ is equivalent to $a_1 \leq b_1$, $a_2 \leq b_2$, $a_1 \leq b_2$, $a_2 \leq b_1$.

This lemma has been formulated for closed intervals. It may be similarly formulated for intervals in which one, or both, ends are open. The proof of the lemma is immediate.

Lemma 2. Let P be a set of points on the real axis, let I be an interval on the real axis, and let $I_P$ be a closed interval on the real axis, whose end points are both in P. Then, $I_P \cap I \cap P \neq \emptyset$ if, and only if $I_P \cap I \neq \emptyset$ and $I \cap P \neq \emptyset$.

Proof: It is easy to see that $I_P \cap I \cap P \neq \emptyset \Rightarrow I_P \cap I \neq \emptyset$. Now, assume that $I_P \cdot I \neq \emptyset$ and that $I \cap P \neq \emptyset$. If at least one of the ends of $I_P$ is in I, this end point is included in the set $I_P \cap I \cap P$. Therefore, we assume that both ends are outside of I. There are three possibilities: (i) both ends lie to the left of I, (ii) both ends lie to the right of I and (iii) the left end lies to the left of I and the right end lies to the right of I. In cases (i) and (ii) we have $I_P \cap I = \emptyset$, which contradicts our assumptions. In case (iii) we have $I \subseteq I_P$, so $I_P \cap I \cap P = I \cap P \neq \emptyset$.

Condition for the Existence of a Solution.

In what follows, we assume that the rectangle R satisfies Properties (1) and (2) as given above. Let x be a machine number in $[\overline{a}_x, \overline{b}_x]$. A set of points is defined.

$$D(\overline{x}) = \{\overline{x} + \overline{y} | \overline{y} \in [\overline{a}_y, \overline{b}_y], \overline{y} \text{ as a machine number}\}.$$

Because of Properties (1) and (2), every point of $D(\overline{x})$ can be written in the form $\overline{a}_x + \overline{a}_y + k\Delta y$, where k is an integer $I(\overline{x})$ is defined to be the smallest interval of real numbers that includes $D(\overline{x})$, namely $I(\overline{x}) = [\overline{x} + \overline{a}_y, \overline{x} + \overline{b}_y]$. The following lemma is needed.

Lemma 3: Assume that at least one point of the sequence $\overline{a}_x + \overline{a}_y + k\Delta y$ (k=0, ±1, ±2, ...) is included in $I'_z$. Given a machine number $\overline{x} \in [\overline{a}_x, \overline{b}_x]$, a necessary and sufficient condition for the existence of a solution in $D(\overline{x})$, i.e., $D(\overline{x}) \cap I'_z \neq \emptyset$ is the condition $I(\overline{x}) \cap I'_z \neq \emptyset$.

Proof: We use Lemma 2 and substitute $$P = \{\overline{a}_x + \overline{a} + k\Delta y | k=0, \pm 1, \pm 2, \ldots\},$$

$$I = I'_z, I_P = I(\overline{x}).$$

Obviously, $D(\overline{x}) = I(\overline{x}) \cap P$. Hence, from Lemma 2, we find that $$I_P \cap I \cap P = I(\overline{x}) \cap I'_z \cap P = D(\overline{x}) \cap I'_z \neq \emptyset \Leftrightarrow I(\overline{x}) \cap I'_z \emptyset, I'_z \cap P \neq \emptyset$$

Because we assumed that $I'_z \cap P \neq \emptyset$, the condition $I(\overline{x}) \cap I'_z \neq \emptyset$ is equivalent to $D(\overline{x}) \cap I'_z \neq \emptyset$.

Theorems.

Theorem 1: Assume that $I'_z$ is closed on both ends and that Properties (1) and (2) are satisfied. A necessary and sufficient condition for the existence of a solution for the + operation, is: At least one integer k, satisfies $$(a'_z - \overline{a}_x - \overline{a}_y)/\Delta y \leq k \leq (b'_z - \overline{a}_x - \overline{a}_y)/\Delta y$$

and at least one machine number $\overline{x}$, satisfies $$\overline{a}_x \leq \overline{x} \leq \overline{b}_x, a'_z - \overline{b}_y \leq x \leq b'_z - \overline{a}_y \quad (2).$$

If the conditions are satisfied (i.e., there exist solutions), for each $\overline{x}$ that satisfies inequality 2, there exist solutions of the form $(\overline{x}, \overline{y})$, where $\overline{x} + \overline{y}$ is in $D(\overline{x})$. For each machine number $\overline{x}$, which is not of this type, there are no solutions.

All solutions with x are of the form $$(\overline{x}, \overline{a}_y + n\Delta y),$$

where $$(a'_z - \overline{x}\overline{a}_y)/\Delta y \leq n \leq (b'_z - \overline{x} - \overline{a}_y)/\Delta y$$

$$n = 0, 1, \ldots, N, N = (\overline{b}_y - \overline{a}_y)/\Delta y.$$

Remark: Theorem 1 was formulated under the assumption that $I'_z$ is closed at both of its ends. If this is not so, the formulation is similar when using the relation < to replace some of the corresponding ≤ relations.

Proof: A number in $D(\overline{x}) \cap I'_z$ must be of the form $\overline{x} + \overline{y} = \overline{a}_x + \overline{a}_y + k\Delta y$ and must be included in $I'_z$. Therefore, from Lemma 3 we see that necessary and sufficient conditions for the existence of a solution are $a'_z \leq \bar{a}_x + \bar{a}_y + k\Delta y \leq b'_z$ for some k and I($\bar{x}) \cap I'_z \neq \emptyset$. The first of these conditions is equivalent to $$(a'_z - \bar{a}_x - \bar{a}_y)/\Delta y \leq k \leq (b'_z - \bar{a}_x - \bar{a}_y)/\Delta y$$

and the second is equivalent to $\bar{x} + \bar{a}_y \leq b'_z$, $\bar{x} + \bar{b}_y \geq a'_z$ from Lemma 1, which is equivalent to $$(a'_z - \bar{b}_y) \leq \bar{x} \leq b'_z - \bar{a}_y.$$

The solutions that correspond to $\bar{x}$ must clearly be of the form $(\bar{x}, \bar{a}_y + n\Delta y)$, with $n=0, 1, \ldots, N$, and they must satisfy $a'_z \leq \bar{x} + \bar{a}_y + n\Delta y \leq b'_z$. Therefore, we must have $$(a'_z - \bar{x} - \bar{a}_y)/\Delta y \leq n \leq (b'_z - \bar{x} - \bar{a}_y)/\Delta y,$$

$$n = 0, 1, \ldots, N.$$

What is claimed, is:

1. A non-transitory computer-readable medium in which computer program instructions are stored, which instructions, when read by a computer, cause the computer to perform a method for verifying a design of a floating point computation unit, comprising the steps of:
   receiving a definition of a floating point operation to test, said definition comprising a first floating point operand having a first floating point input interval and a second floating point operand having a second floating point input interval, and a floating point result having a floating point output interval, said first and second floating point input intervals and said floating point output interval having respective upper and lower floating point limits;
   defining a first reduced interval for said first floating point operand responsively to said upper and lower floating point limits of said second floating point input interval and said floating point output interval;
   selecting a first machine number in said first floating point input interval;
   defining a second reduced interval for said second floating point operand responsively to said first machine number and to said upper and lower limits of said floating point output interval;
   selecting a second machine number in said second reduced interval;
   and testing said floating point operation in said design using said first machine number and said second machine number as said first floating point operand and said second floating point operand.

2. The non-transitory computer-readable medium according to claim 1, further comprising at least one limitation taken from a group of limitations consisting of:
   wherein at least one of said first machine number and said second machine number is chosen randomly;
   wherein said steps of defining said first reduced interval and defining said second reduced interval are performed by defining new boundaries for said first floating point input interval and said second floating point input interval that are referenced to a set of real numbers;
   wherein said set of real numbers is a set $$A_{z,y} = \{(x,y) | \bar{a}_x \leq x \leq \bar{b}_x, \bar{a}_y \leq y \leq \bar{b}_y, x+y \in I'_z\}$$

wherein
   x and y are real numbers in said set of real numbers,
   $\bar{a}_x$ is a smallest machine number in said first floating point input interval,
   $\bar{a}_y$ is a smallest machine number in said second floating point input interval,
   $\bar{b}_x$ is a largest machine number in said first floating point input interval,
   $\bar{b}_y$ is a largest machine number in said second floating point input interval, and $$I'_z = \{z | \bar{a}_z \leq \text{round}(z) \leq \bar{b}_z\};$$

wherein said steps of defining said first reduced interval and defining said second reduced interval are performed by defining new boundaries for said first floating point input interval and said second floating point input interval such that for all real numbers (x, y) in a set of real numbers $$A_{z,y} = \{(x,y) | \bar{a}_x \leq x \leq \bar{b}_x, \bar{a}_y \leq y \leq \bar{b}_y, x+y \in I'_z\}$$

wherein
   said first reduced interval and said second reduced interval have boundaries such that $$A_x = \max\{\bar{a}_x, a'_z - \bar{b}_y\} \leq x \leq \min\{\bar{b}_x, b'_z - \bar{a}_y\} = B_x$$

and $$A_y = \max\{\bar{a}_y, a'_z - b_x\} \leq y \leq \min\{b_y, b'_z - \bar{a}_x\} = B_y$$

wherein
   x and y are real numbers in said set of real numbers,
   $A_x$ is a lower boundary of said first reduced interval,
   $B_x$ is an upper boundary of said first reduced interval,
   $A_y$ is a lower boundary of said second reduced interval,
   $B_y$ is an upper boundary of said second reduced interval,
   $\bar{a}_x$ is a smallest machine number in said first floating point input interval,
   $\bar{a}_y$ is a smallest machine number in said second floating point input interval,
   $\bar{b}_x$ is a largest machine number in said first floating point input interval,
   $\bar{b}_y$ is a largest machine number in said second floating point input interval, $$I'_z = \{z | \bar{a}_z \leq \text{round}(z) \leq \bar{b}_z\},$$

$a'_z$ is a lower boundary of $I'_z$, and
   $b'_z$ is an upper boundary of $I'_z$;
   wherein said floating point operation is addition; and
   wherein said floating point operation is subtraction.

3. A non-transitory computer-readable medium in which computer program instructions are stored, which instructions, when read by a computer, cause the computer to perform a method for verifying a design of a floating point computation unit, comprising:
   receiving a definition of a floating point operation to test, said definition comprising a first floating point operand having a first floating point input interval and a second floating point operand, having a second floating point input interval, and a floating point result having a floating point output interval, said input and output intervals having respective upper and lower floating point limits, whereby said first floating point input interval and said second floating point input interval define a region in an operand plane having a first axis and a second axis corresponding respectively to said first floating point operand and said second floating point operand;
   dividing said region into subrectangles, each of said subrectangles having respective bounds, such that within at least a first subrectangle, a first step size between machine numbers in any first succession along said second axis is constant, and a second step size between said machine numbers in any second succession along said first axis is no less than said first step size;
   defining a reduced interval for said first floating point operand responsively to said upper and lower floating point limits of said second floating point input interval and said floating point output interval;

selecting a first machine number in said reduced interval;
defining an integer range responsively to said respective bounds of said first subrectangle, to said first machine number, and to said first step size;
selecting an integer within said integer range;
determining a second machine number responsively to said integer and to said first step size; and
testing said floating point operation in said design using said first machine number and said second machine number as said first floating point operand and said second floating point operand.

4. The non-transitory computer-readable medium according to claim 3, further comprising at least one limitation taken from a group of limitations consisting of:
wherein at least one of said first machine number, said integer, and said second machine number is chosen randomly;
further comprising the steps of:
verifying an existence of a second integer in said first subrectangle that satisfies a relation $$(a'_z - \bar{a}_x - \bar{a}_y)/\Delta y \leq k \leq (b'_z - \bar{a}_x - \bar{a}_y)/\Delta y$$

wherein
k is said second integer;
$\bar{a}_x$ is a smallest machine number of said first floating point input interval,
$\bar{a}_y$ is a smallest machine number of said second floating point input interval,
$I'_z$ is an interval defined by a set $\{z | \bar{a}_z \leq \text{round}(z) \leq \bar{b}_z\}$,
$a'_z$ is a lower boundary of said interval $I'_z$, and
$b'_z$ is an upper boundary of said interval $I'_z$
$\Delta y$ is said second step size;
wherein said region further comprises a second subrectangle, a third step size between said machine numbers in any third succession along said first axis being constant, and a fourth step size between said machine numbers in any fourth succession along said second axis being no less than said third step size;
wherein said floating point operation is addition; and
wherein said floating point operation is subtraction.

5. A non-transitory computer-readable medium in which computer program instructions are stored, which instructions, when read by a computer, cause the computer to perform a method for generating a test case for submission to a design verification system, said test case having a first input operand, a second input operand and a floating point arithmetic operation performed thereon to yield an output result, comprising the steps of:
defining a first range that contains a set of first machine numbers;
defining a second range that contains a set of second machine numbers;
defining a third range having a lower bound that is a result of a round operation on a minimum value of said output result, and having an upper bound that is a result of said round operation on a maximum value of said output result, wherein instances of said first input operand and said second input operand are in said first range and said second range, respectively;
defining a subrectangle having a first axis comprising said first range and a second axis comprising said second range;
subdividing said subrectangle into subregions, each of said subregions having a first property, wherein a first step size along said first axis between successive ones of said first machine numbers is constant, and a second property, wherein a second step size along said second axis between successive ones of said second machine numbers is at least as large as said first step size;
identifying one of said subregions wherein an integer k exists that satisfies a first inequality $$(a'_z - \bar{a}_x - \bar{a}_y)/\Delta y \leq k \leq (b'_z - \bar{a}_x - \bar{a}_y)/\Delta y;$$

and wherein a machine number $\bar{x}$ exists that satisfies second and third inequalities $$\bar{a}_x \leq \bar{x} \leq \bar{b}_x, a'_z - \bar{b}_y \leq \bar{x} \leq b'_z - \bar{a}_y;$$

choosing an integer n with respect to said one subregion such that $$(a'_z - \bar{x} - \bar{a}_y)/\Delta y \leq n \leq (b'_z - \bar{x} - \bar{a}_y)/\Delta y;$$

and
submitting to said design verification system said machine number $\bar{x}$ as said first input operand and a quantity ($\bar{a}_y + n\Delta y$) as said second input operand for execution therein as said test case;
wherein
$\bar{a}_x$ is a smallest one of said first machine numbers,
$\bar{a}_y$ is a smallest one of said second machine numbers,
$\bar{b}_x$ is a largest one of said first machine numbers,
$\bar{b}_y$ is a largest one of said second machine numbers,
$a'_z$ is said lower bound of said third range,
$b'_z$ is said upper bound of said third range, and
$\Delta y$ is said second step size.

6. The non-transitory computer-readable medium according to claim 5, further comprising at least one limitation taken from a group of limitations consisting of:
wherein said subregions are subrectangles;
wherein said arithmetic operation is addition;
wherein said arithmetic operation is subtraction; and
wherein said first range, said second range, and said third range each have a minimum size.

* * * * *